US008981699B2

(12) United States Patent
Obata et al.

(10) Patent No.: US 8,981,699 B2

(45) Date of Patent: Mar. 17, 2015

(54) ROTATING ELECTRIC MACHINE FOR ELECTRIC VEHICLE, DRIVE CONTROL DEVICE AND INSULATION DIAGNOSIS METHOD

(75) Inventors: Koji Obata, Hitachi (JP); Yutaka Matsunobu, Mito (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 183 days.

(21) Appl. No.: 13/516,100

(22) PCT Filed: Aug. 23, 2010

(86) PCT No.: PCT/JP2010/064187

§ 371 (c)(1), (2), (4) Date: Jul. 20, 2012

(87) PCT Pub. No.: WO2011/074287

PCT Pub. Date: Jun. 23, 2011

(65) Prior Publication Data

US 2013/0033214 A1 Feb. 7, 2013

(30) Foreign Application Priority Data

Dec. 16, 2009 (JP) ................................ 2009-284794

(51) Int. Cl.

| | |
|---|---|
| ***G01R 31/02*** | (2006.01) |
| ***G01R 31/12*** | (2006.01) |
| ***H02K 11/00*** | (2006.01) |
| ***B60L 3/00*** | (2006.01) |
| *G01R 31/34* | (2006.01) |

(52) U.S. Cl.

CPC .......... *G01R 31/1227* (2013.01); *H02K 11/001* (2013.01); *B60L 3/0069* (2013.01); *G01R 31/343* (2013.01); *G01R 31/346* (2013.01); *Y02T 10/641* (2013.01); *B60L 2200/26* (2013.01)

USPC ....... 318/490; 324/765.01; 324/541; 324/544

(58) Field of Classification Search

USPC ............. 318/490; 324/765.01, 541, 544, 551, 324/536, 601, 530, 500, 546

See application file for complete search history.

(56) References Cited

U.S. PATENT DOCUMENTS

| | | | | |
|---|---|---|---|---|
| 5,107,447 A * | 4/1992 | Ozawa et al. | .................. | 702/58 |
| 5,214,595 A * | 5/1993 | Ozawa et al. | .................. | 702/58 |
| 5,469,067 A * | 11/1995 | Endoh et al. | .................. | 324/551 |
| 6,262,550 B1 * | 7/2001 | Kliman et al. | ................ | 318/565 |

(Continued)

FOREIGN PATENT DOCUMENTS

| | | |
|---|---|---|
| JP | 4-296673 A | 10/1992 |
| JP | 2000-32711 A | 1/2000 |

(Continued)

OTHER PUBLICATIONS

International Search Report including English translation dated Nov. 16, 2010 (Four (4) pages).

*Primary Examiner* — Eduardo Colon Santana

*Assistant Examiner* — Bickey Dhakal

(74) *Attorney, Agent, or Firm* — Crowell & Moring LLP

(57) ABSTRACT

A rotating electric machine for an electric vehicle, installed in a vehicle and driven by an inverter power source, includes: a partial discharge measuring device that measures partial discharges occurring in insulated areas between windings, between phases and between the rotating electric machine and a ground.

17 Claims, 18 Drawing Sheets

(56) References Cited

U.S. PATENT DOCUMENTS

Figure 1:
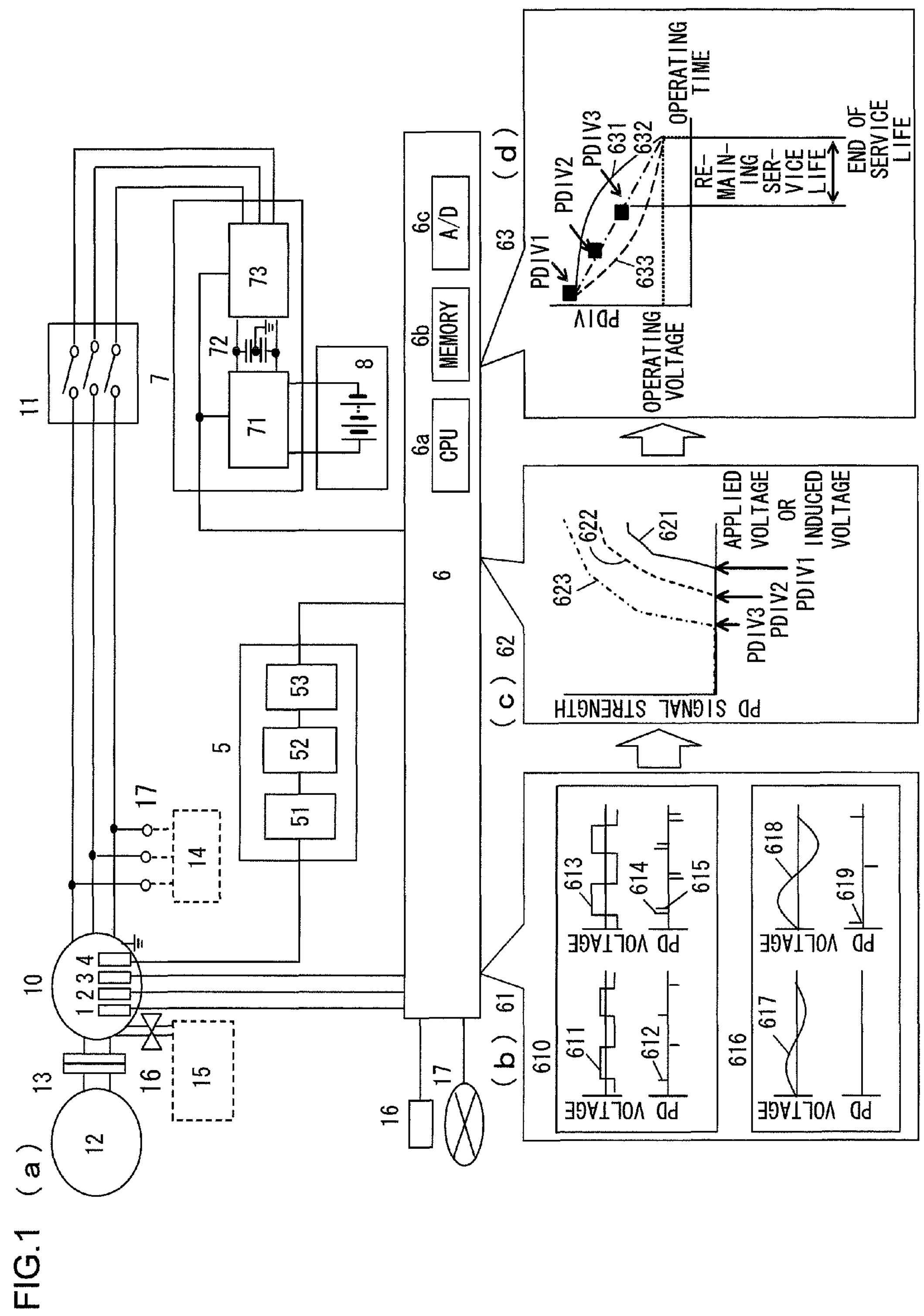

| | | | | |
|---|---|---|---|---|
| 6,872,106 | B2 * | 3/2005 | Kanno | 440/2 |
| 7,746,082 | B2 * | 6/2010 | Maruyama et al. | 324/544 |
| 7,764,042 | B2 * | 7/2010 | Obata et al. | 318/801 |
| 7,898,264 | B2 * | 3/2011 | Horikoshi et al. | 324/551 |
| 8,143,899 | B2 * | 3/2012 | Younsi et al. | 324/523 |
| 8,162,627 | B2 * | 4/2012 | Hattori et al. | 417/410.1 |
| 8,311,691 | B2 * | 11/2012 | Matsumoto | 701/22 |
| 8,368,404 | B2 * | 2/2013 | Wakimoto et al. | 324/536 |
| 8,499,873 | B2 * | 8/2013 | Takamatsu et al. | 180/165 |
| 2005/0189889 | A1 * | 9/2005 | Wirtz et al. | 318/105 |
| 2005/0218906 | A1 * | 10/2005 | Younsi et al. | 324/551 |
| 2005/0218907 | A1 * | 10/2005 | Lee et al. | 324/551 |
| 2006/0022679 | A1 | 2/2006 | Obata et al. | |
| 2007/0139056 | A1 * | 6/2007 | Kaneiwa et al. | 324/536 |
| 2007/0253806 | A1 * | 11/2007 | Russell | 415/15 |
| 2009/0251154 | A1 * | 10/2009 | Lindsey | 324/551 |

FOREIGN PATENT DOCUMENTS

| | | | |
|---|---|---|---|
| JP | 2000-304837 | A | 11/2000 |
| JP | 2004-320955 | A | 11/2004 |
| JP | 2006-38688 | A | 2/2006 |
| JP | 2006-288153 | A | 10/2006 |
| JP | 2006288153 | A | * 10/2006 |
| JP | 2007-232517 | A | 9/2007 |
| JP | 2008-2847 | A | 1/2008 |
| JP | 2008002847 | A | * 1/2008 |
| JP | 2009-11054 | A | 1/2009 |
| JP | 2009-250668 | A | 10/2009 |
| WO | WO 2008/146897 | A1 | 12/2008 |

* cited by examiner 4a
4b
141
142
20
21
(a)
10
26
25
24
20
21
(b)
CURRENT
1410
1420
t
(c)
CURRENT
1411
1421
t
(d)
CURRENT
1422
t
(e)

ROTATING ELECTRIC MACHINE FOR ELECTRIC VEHICLE, DRIVE CONTROL DEVICE AND INSULATION DIAGNOSIS METHOD

TECHNICAL FIELD

The present invention relates to a rotating electric machine for an electric vehicle, a drive control device that controls the rotating electric machine and a rotating electric machine insulation diagnosis method.

BACKGROUND ART

There are devices known in the related art that measure a partial discharge that may occur in a rotating electric machine engaged in operation and provide a diagnosis of the insulation conditions in the rotating electric machine based upon the measurement results (see, for instance, patent literature 1). Such a device is equipped with a first detector disposed in close proximity to a stator winding of the rotating electric machine, which detects a first high-frequency signal generated due to a partial discharge occurring at the stator winding. It is further equipped with a second detector disposed inside a frame housing the stator winding and connected in series to the first detector, which detects a second high-frequency signal propagated from the first high-frequency signal. Then, the device determines the insulation conditions of the rotating electric machine, i.e., the state of health of the rotating electric machine, by analyzing components of a specific frequency band of the first and second high-frequency signals.

CITATION LIST

Patent Literature

Patent literature 1: Japanese Laid Open Patent Publication No. 2000-304837

SUMMARY OF THE INVENTION

Technical Problem

However, the rotating electric machine insulation diagnosis device in the related art described above, designed specifically to diagnose the insulation conditions in a large high-voltage rotating electric machine installed at a fixed location and equipped with large and expensive detectors for purposes of partial discharge detection, is not suited for detecting the insulation conditions in rotating electric machines for electric vehicles. As the popularity of electric vehicles and hybrid electric vehicles with rotating electric machines installed therein increases, it becomes a matter of critical interest to ensure that the insulation conditions of the rotating electric machines installed in electrically driven vehicles be accurately diagnosed. A rotating electric machine for an electric vehicle is bound to be used under extreme and varying environment conditions, such as a drive environment and drive characteristics by an inverter power source, a changeable environment with great variance of conditions and rigorous structural and design-related requirements unique to the vehicular applications. This means that it will be extremely difficult or impossible to diagnose the insulation conditions of a rotating electrical machine installed in an electric vehicle with an insulation diagnosis device in the related art.

Solution to the Problem

According to the 1st aspect of the present invention, a rotating electric machine for an electric vehicle, installed in a vehicle and driven by an inverter power source, comprises: a partial discharge measuring device that measures partial discharges occurring in insulated areas between windings, between phases and between the rotating electric machine and a ground.

According to the 2nd aspect of the present invention, it is preferred that in the rotating electric machine for an electric vehicle according to the 1st aspect, the partial discharge measuring device is constituted with a conductive wire wound around an entire circumference of a stator core over an area near a coil end of the stator coil and detects electromagnetic waves induced by a partial discharge.

According to the 3rd aspect of the present invention, it is preferred that in the rotating electric machine for an electric vehicle according to the 1st aspect, the partial discharge measuring device is configured with a temperature sensor that measures a temperature inside the rotating electric machine and an electromagnetic capacitance connected to ends of two output lines extending from the temperature sensor, with the output lines extending from the temperature sensor wound around an entire circumference of a stator core over an area near a coil end of the stator core.

According to the 4th aspect of the present invention, it is preferred that in the rotating electric machine for an electric vehicle according to the 2nd or 3rd aspect, a conductive wire or an output line located on one side is disposed so as to run along the entire circumference of the stator core in a clockwise direction over an area near one coil end of the stator coil and the conductive wire or the output line located on another side is disposed so as to run along the circumference of the stator core in a counterclockwise direction over an area near another coil end of the stator coil.

According to the 5th aspect of the present invention, the rotating electric machine for an electric vehicle according to the 2nd aspect may further comprise: a temperature sensor that measures a temperature in the rotating electric machine.

According to the 6th aspect of the present invention, the rotating electric machine for an electric vehicle according to the 1st aspect may further comprise: an atmospheric pressure sensor that measures atmospheric pressure in the rotating electric machine.

According to the 7th aspect of the present invention, the rotating electric machine for an electric vehicle according to the 1st aspect may further comprise: a humidity sensor that measures humidity in the rotating electric machine.

According to the 8th aspect of the present invention, the rotating electric machine for an electric vehicle according to the 1st aspect may further comprise: piping and a valve in communication with the inside of the rotating electric machine.

According to the 9th aspect of the present invention, the rotating electric machine for an electric vehicle according to the 1st aspect may further comprise: an external power terminal via which power is exchanged with an external power source, the external power terminal being provided independent of a power terminal via which power is exchanged with the inverter power source.

According to the 10th aspect of the present invention, a drive control device that controls drive of a rotating electric machine for an electric vehicle according to the 1st aspect, comprises: an inverter power source that drives the rotating electric machine by applying an inverter pulse voltage to the rotating electric machine; an extraction unit that extracts a partial discharge signal from an output signal provided from the partial discharge measuring device; and a diagnosis unit that detects a partial discharge inception voltage based upon the partial discharge signal extracted by the extraction unit and executes insulation diagnosis for the rotating electric machine based upon a change occurring in the partial discharge inception voltage over time.

According to the 11th aspect of the present invention, it is preferred that in the drive control device according to the 10th aspect that controls drive of a rotating electric machine for an electric vehicle, during the insulation diagnosis executed for the rotating electric machine, the inverter power source applies an inverter pulse voltage, the inverter voltage being higher than a drive voltage applied for the rotating electric machine during regular operation; and the extraction unit extracts the partial discharge signal by executing high pass filter processing on the output signal from the partial discharge measuring device, thus removing inverter pulse noise attributable to the inverter power source.

According to the 12th aspect of the present invention, it is preferred that in the drive control device according to the 11th aspect that controls drive of a rotating electric machine for an electric vehicle, the high pass filter has a cutoff frequency assumed at a point at which a frequency spectrum of the inverter pulse noise and a frequency spectrum of a minimum partial discharge signal intersect each other.

According to the 13th aspect of the present invention, it is preferred that in the drive control device according to the 10th aspect that controls drive of a rotating electric machine for an electric vehicle, during the insulation diagnosis executed for the rotating electric machine, the inverter power source applies an inverter pulse voltage, the inverter pulse voltage being higher than a drive voltage applied for the rotating electric machine during regular operation; and the extraction unit extracts, as the partial discharge signal, a signal generated at a phase in the output signal from the partial discharge measuring device, the phase being different from a phase at which inverter pulse noise attributable to the inverter power source has occurred.

According to the 14th aspect of the present invention, it is preferred that in the drive control device according to the 10th aspect that controls drive of a rotating electric machine for an electric vehicle, during the insulation diagnosis executed for the rotating electric machine, the inverter power source executes field control for the rotating electric machine so as to induce at the rotating electric machine a voltage higher than the voltage induced during regular operation; and the extraction unit extracts the partial discharge signal by removing an induced voltage component from the output signal from the partial discharge measuring device, the induced voltage component representing the induced voltage generated at the rotating electric machine.

According to the 15th aspect of the present invention, the drive control device that controls drive of a rotating electrical machine for an electric vehicle according to the 8th aspect may comprise: an inverter power source that drives the rotating electric machine by applying an inverter pulse voltage to the rotating electric machine; an extraction unit that extracts a partial discharge signal from an output signal provided from the partial discharge measuring device; and a diagnosis unit that detects a partial discharge inception voltage based upon the partial discharge signal extracted by the extraction unit and executes insulation diagnosis for the rotating electric machine based upon a change occurring in the partial discharge inception voltage over time, wherein: during the insulation diagnosis executed for the rotating electric machine, an internal atmospheric pressure at the rotating electric machine is lowered via a vacuum pump connected to the piping and the valve.

According to the 16th aspect of the present invention, the drive control device that controls drive of a rotating electric machine for an electric vehicle according to the 9th aspect, may comprise: an inverter power source that drives the rotating electric machine by applying an inverter pulse voltage to the rotating electric machine; a circuit breaker unit disposed between the inverter power source in the rotating electric machine; an extraction unit that extracts a partial discharge signal from an output signal provided from the partial discharge measuring device; and a diagnosis unit that detects a partial discharge inception voltage based upon the partial discharge signal extracted by the extraction unit and executes insulation diagnosis for the rotating electric machine based upon a change occurring in the partial discharge inception voltage over time, wherein: during the insulation diagnosis executed for the rotating electric machine, the circuit breaker unit is opened and an insulation test voltage is applied to the rotating electrical machine, the insulation test voltage being originated from the external power source and being provided via the external power terminal.

According to the 17th aspect of the present invention, the drive control device according to the 10th aspect that controls drive of a rotating electric machine for an electric vehicle, may further comprise: a recording unit that records, together with the partial discharge inception voltage, temperature, humidity and atmospheric pressure at the rotating electric machine measured during the insulation diagnosis executed for the rotating electric machine; and a conversion unit that converts the partial discharge inception voltage recorded in the recording unit to a value corresponding to a specific temperature, specific humidity and a specific atmospheric pressure measured at the rotating electric machine, wherein: the diagnosis unit diagnoses an insulation conditions at the rotating electric machine based upon the partial discharge inception voltage value resulting from conversion executed by the conversion unit.

According to the 18th aspect of the present invention, it is preferred that in the drive control device according to the 10th aspect that controls drive of a rotating electric machine for an electric vehicle, the diagnosis unit executes insulation diagnosis based upon change occurring in the partial discharge inception voltage over time by factoring in thermal deterioration, mechanical deterioration, oil resistance deterioration and hydrolysis resistance deterioration occurring in insulated areas of the rotating electric machine, located between windings, between phases and between the rotating electric machine and a ground.

According to the 19th aspect of the present invention, an insulation diagnosis method adopted in conjunction with a rotating electric machine for an electric vehicle, comprises: measuring, via a sensor, a partial discharge occurring in an insulated area of the rotating electric machine for an electric vehicle, which is installed in a vehicle and driven with an inverter power source, the insulating area being between windings or between phases at the rotating electric machine or between the rotating electric machine and a ground; extracting a partial discharge signal from an output signal provided from the sensor; detecting a partial discharge inception voltage based upon the extracted partial discharge signal; and executing insulation diagnosis for the rotating electric machine for an electric vehicle based upon a change occurring in the partial discharge inception voltage over time.

Advantageous Effect of the Invention

According to the present invention, the insulation conditions of a rotating electric machine for an electric vehicle, which is driven with an inverter power source, can be diagnosed with ease at low cost while it is engaged in regular operation without having to dismount the rotating electric machine from the electric vehicle.

Figure 3:
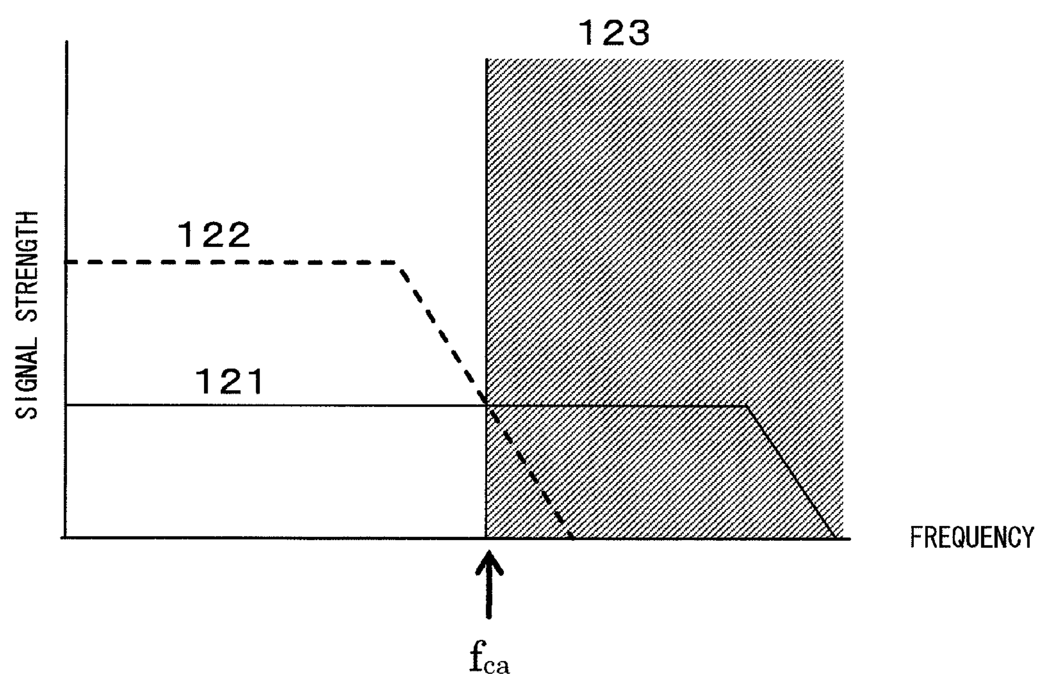
Figure 4:
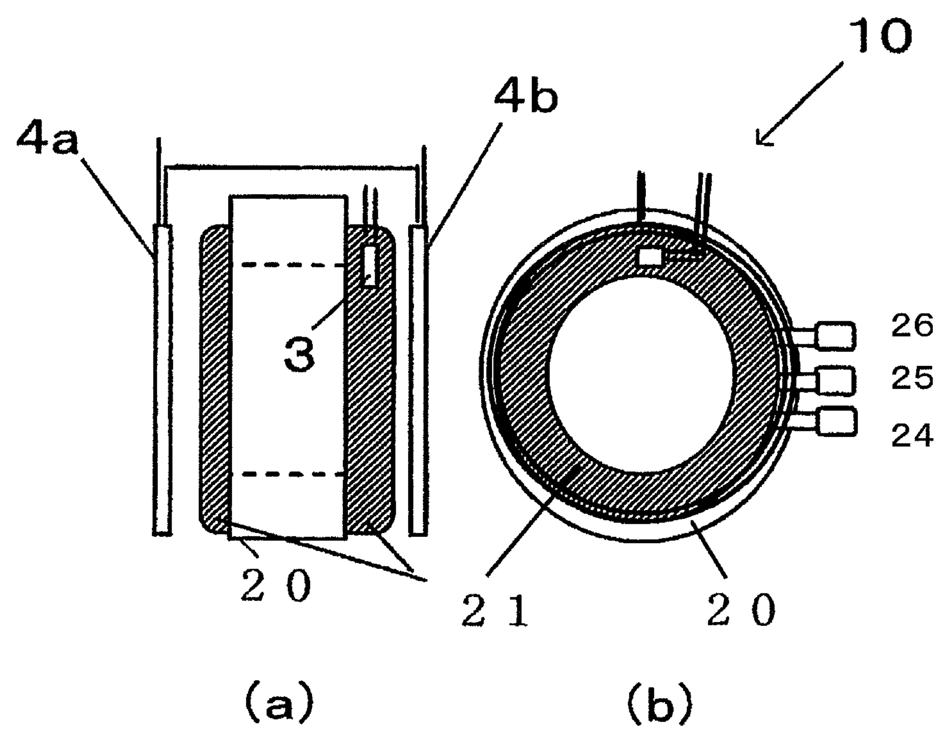

BRIEF DESCRIPTION OF THE DRAWINGS (FIG. 1) A diagram in (a) showing the structures of a rotating electric machine for an electric vehicle and its drive control device achieved in an embodiment, rotating electric machine partial discharge measurement data provided in (b), a diagram in (c) indicating the partial discharge signal strength relative to the voltage applied to the rotating electric machine or the voltage induced at the rotating electric machine, and a diagram in (d) showing how insulation conditions are diagnosed based upon a change in the partial discharge inception voltage occurring over time (FIG. 2) The mounting structure adopted for the partial discharge measuring sensor and the temperature sensor (FIG. 3) The frequency band characteristics of the partial discharge measuring sensor (FIG. 4) A two-piece partial discharge measuring sensor set achieved in a variation by disposing two separate partial discharge measuring sensors, one by coil end and the other at another coil end (FIG. 5) An illustration of the principle of the measurement executed by the two-piece partial discharge measuring sensor set achieved in the variation shown in FIG. 4

Figure 6:
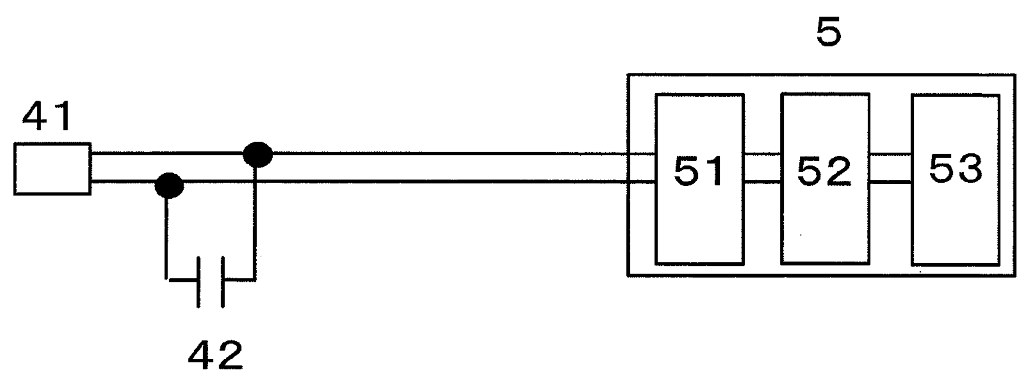

(FIG. 6) A configuration that allows a temperature sensor to be used for partial discharge measurement (FIG. 7) A diagram indicating the frequency characteristics observed during the partial discharge measurement by the temperature sensor/partial discharge measuring sensor shown in FIG. 6

Figure 8:
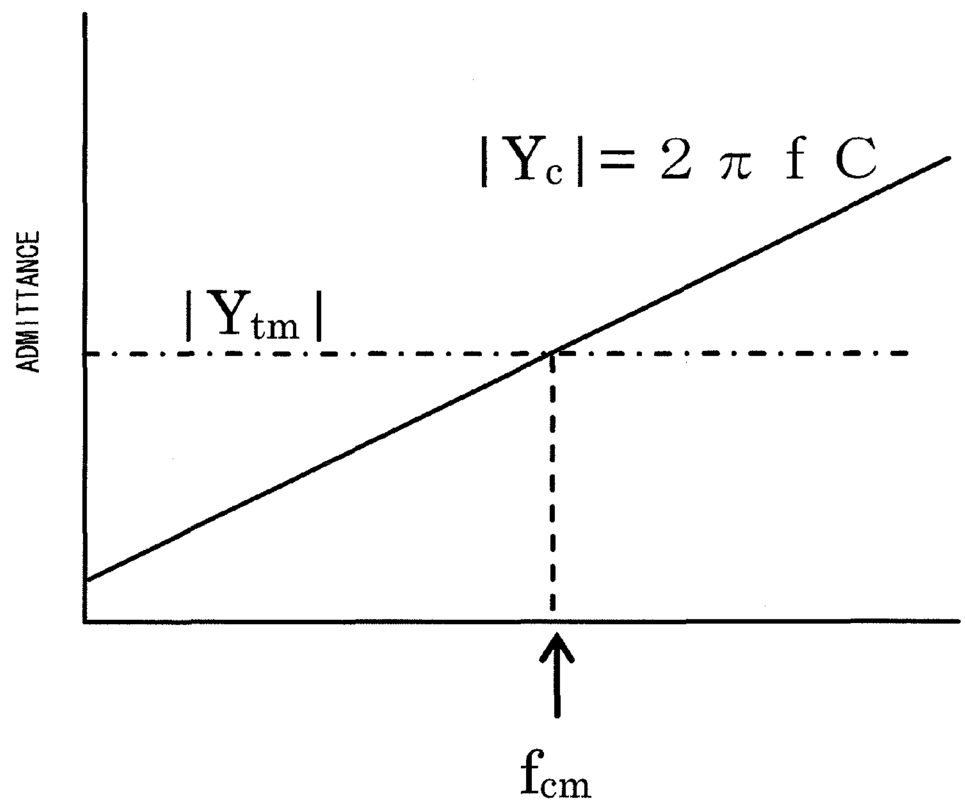
Figure 9:
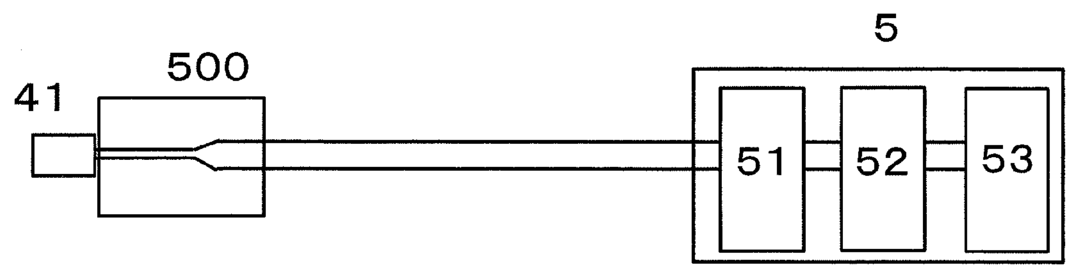
Figure 15:
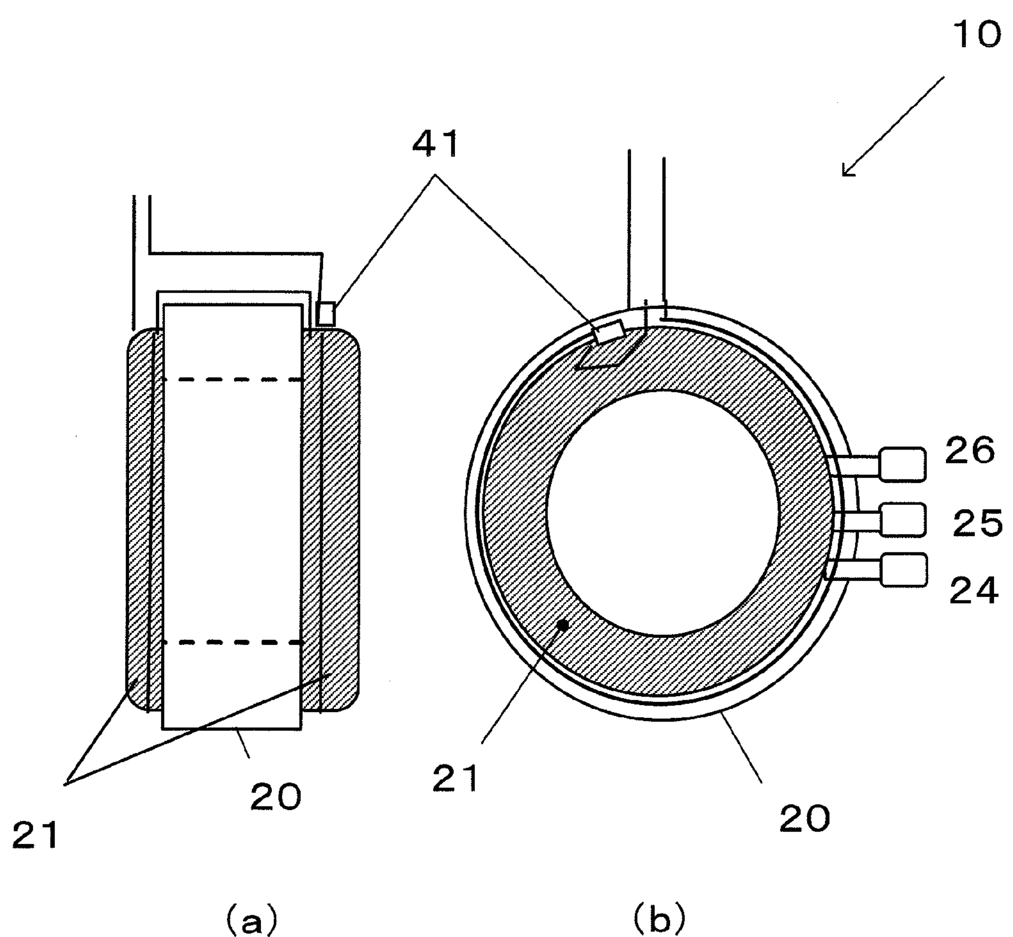
Figure 16:
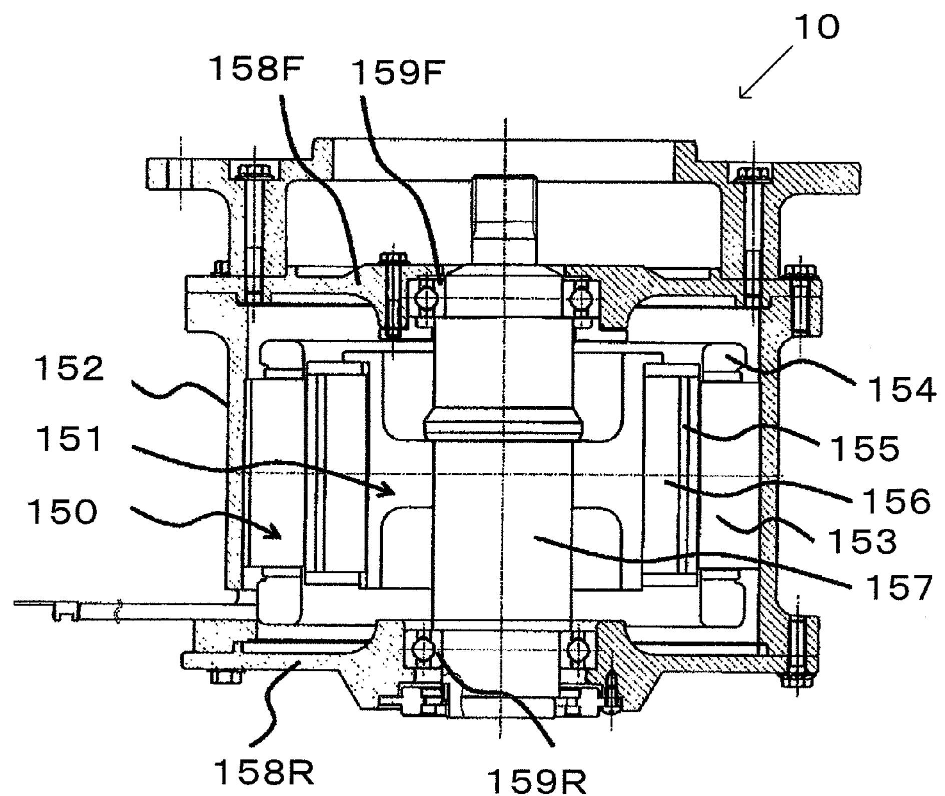
Figure 17:
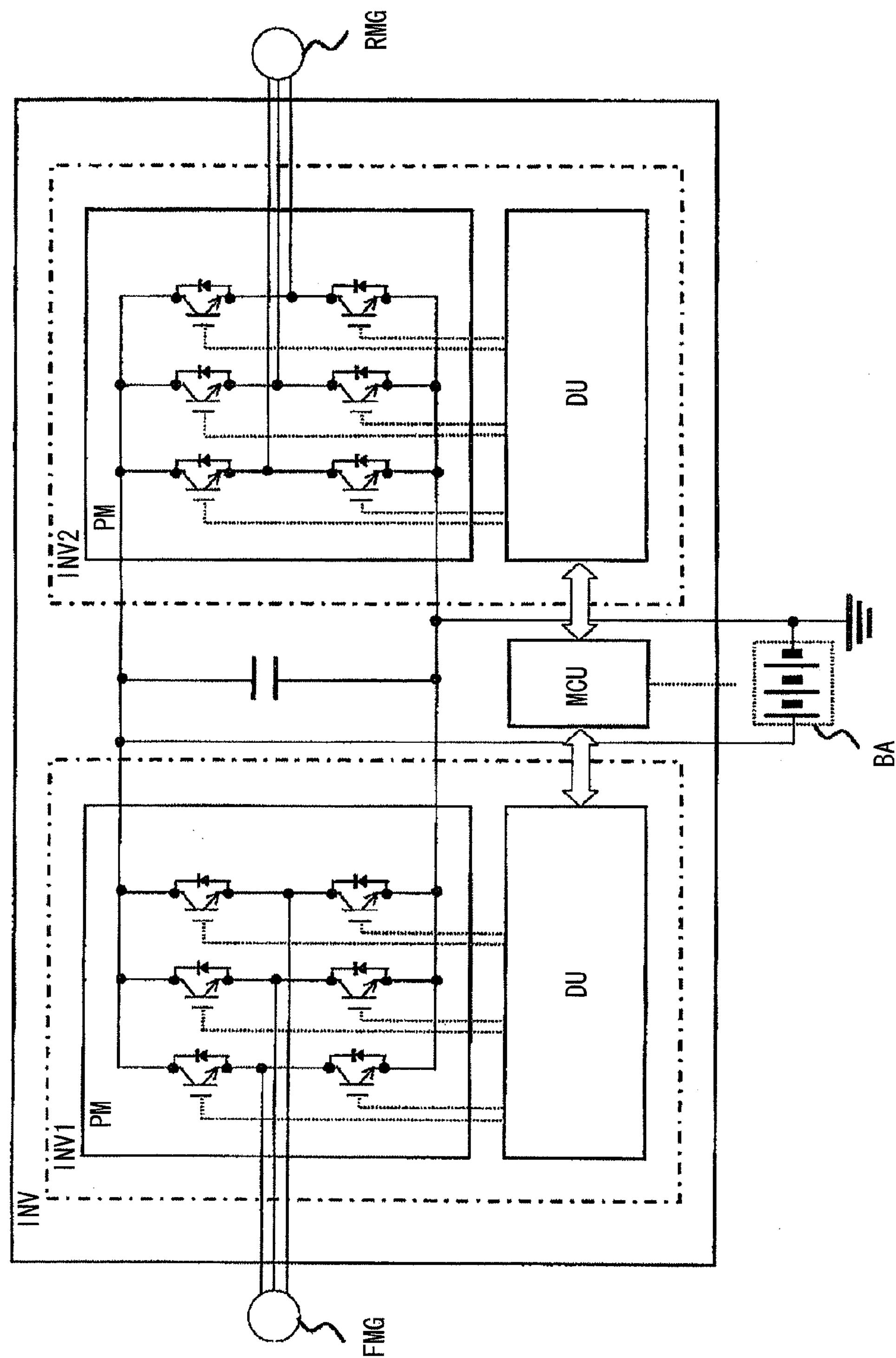

(FIG. 8) A diagram indicating the relationship of the admittance of the temperature sensor/partial discharge measuring sensor shown in FIG. 6 and the admittance of the capacitor (FIG. 9) A structure that may be adopted in the temperature sensor/partial discharge measuring sensor in a variation (FIG. 10) An example of a positional arrangement that may be adopted when installing the temperature sensor/partial discharge measuring sensor in FIG. 6 or FIG. 9 at the rotating electric machine (FIG. 11) A two-piece temperature sensor/partial discharge measuring sensor set achieved in a variation by splitting the temperature sensor/partial discharge measuring sensor in FIG. 6 or FIG. 9 into two parts and disposing one part by a coil end and the other part by another coil end (FIG. 12) An example of a wiring layout achieved by routing the wiring for the temperature sensor/partial discharge measuring sensor in FIG. 6 or FIG. 9 from one coil end to another coil end (FIG. 13) An example of a wiring layout achieved by winding two wiring lines from the temperature sensor/partial discharge measuring sensor, one in the clockwise direction along the circumference of the stator core and the other in the counterclockwise direction along the circumference of the stator core (FIG. 14) An example of a wiring layout achieved by winding two wiring lines from the temperature sensor/partial discharge measuring sensor, one in the clockwise direction along the circumference of the stator core and the other in the counterclockwise direction along the circumference of the stator core (FIG. 15) An example of a wiring layout achieved by winding two wiring lines from the temperature sensor/partial discharge measuring sensor, one in the clockwise direction along the circumference of the stator core and the other in the counterclockwise direction along the circumference of the stator core (FIG. 16) A sectional view of a rotating electric machine taken along the axial direction (FIG. 17) The circuit structure of an inverter used in a drive system for an electric vehicle or a hybrid electric vehicle (FIG. 18) A diagram pertaining to a traveling drive system for a hybrid electric vehicle equipped with the rotating electric machine shown in FIG. 16 and the inverter system shown in FIG. 17

DESCRIPTION OF EMBODIMENTS

The following is a description of an embodiment achieved by adopting the rotating electric machine, the drive control device for the rotating electric machine and the insulation diagnosis method according to the present invention in a rotating electric machine installed in an electric vehicle or a hybrid electric vehicle. It is to be noted that the rotating electric machine, the drive control device for the rotating electric machine and the insulation diagnosis method according to the present invention may be further adopted in a rotating electric machine for a rail vehicle and a rotating electric machine for a construction machine or a civil engineering vehicle, as well as in a rotating electric machine installed in an automobile.

FIG. 1(*a*) is a block diagram showing the structure achieved in the embodiment. A rotating electric machine 10, which is a traveling drive source of a hybrid electric vehicle, is mechanically linked with an axle, an engine or another rotating electric machine 12 via a gear unit or a coupling 13. It is to be noted that any dynamo electric machine among all conceivable types of dynamo electric motors and generators, including an induction machine, a synchronous machine and a DC machine, may be used as the rotating electric machine 10. It is also to be noted that the term "rotating electric machine" is used in this description to refer to any of all types of rotating electric machines including the induction machine, the synchronous machine and the DC machine listed above. The rotating electric machine is a motor/generator capable of functioning as a motor that generates a drive force as it is driven with a drive power source such as an inverter or a converter and as a generator that generates an induced voltage as it is driven from the load side.

An inverter pulse voltage is applied from an inverter power source 7 to the rotating electric machine 10, and as the rotating electric machine 10 is thus rotationally driven, it generates a drive force. The inverter power source 7 boosts, via a DC-DC converter 71, DC power provided from a battery 8, smoothes the boosted DC voltage at a capacitor 72 and then converts the DC voltage to an AC voltage at an inverter 73. A circuit breaker 11 is disposed between the inverter power source 7 and the rotating electric machine 10. The circuit breaker 11 is set in a connected (ON) state when executing insulation diagnosis while driving the rotating electric machine 10 with the inverter power source 7, whereas the circuit breaker 11 is set in a disconnected (OFF) state when executing insulation diagnosis by using the voltage induced at the rotating electric machine 10.

An atmospheric pressure sensor 1, a humidity sensor 2, a temperature sensor 3 and a partial discharge measuring sensor 4 are built into the rotating electric machine 10. In addition, external piping and a valve 16 used to achieve a connection with a vacuum pump 15 are disposed at the rotating electric machine 10 and thus, the atmospheric pressure inside the rotating electric machine 10 can be lowered via the vacuum pump 15. In addition to a power terminal (not shown) via which power is exchanged with the inverter power source 7, a separate external power terminal 17 to connect with an external power source 14 is disposed at the rotating electric machine 10. As a result, an insulation test voltage 17 originating from the external power source 14 instead of the inverter power source 7 can be applied to the rotating electric machine 10 via the external power terminal. The external piping, the valve 16, the vacuum pump 15, the terminal 17 and the external power source 14 will be described in detail later.

A partial discharge measuring unit 5 measures a partial discharge occurring at the rotating electric machine 10 via the partial discharge measuring sensor 4 installed in the rotating electric machine 10. The partial discharge measuring unit 5 includes a signal detection unit 51, a high pass filter 52 and a voltmeter 53. A partial discharge signal indicating the partial discharge measured with the partial discharge measuring sensor 4 by applying the test voltage is converted to a voltage signal at the signal detection unit 51. Any inverter pulse noise in the voltage signal resulting from the conversion is eliminated through the high pass filter 52. The noise-free voltage signal is then converted to data via the voltmeter 53 constituted with, for instance, an A/D converter, and is thus measured as the data. The partial discharge signal data thus obtained through the measurement are transmitted to a control/data processing device 6.

The control/data processing device 6 comprises a CPU 6*a* and peripheral components such as a memory 6*b* and an A/D converter 6*c*. The control/data processing device 6 applies an inverter pulse voltage to the rotating electric machine 10 by controlling the inverter power source 7, measures a partial discharge occurring in the rotating electric machine 10 via the partial discharge measuring sensor 4 and the partial discharge measuring unit 5 and diagnoses the insulation conditions in the rotating electric machine 10, i.e., the remaining service life of the rotating electric machine 10, based upon the measurement data. In addition, the control/data processing device 6 measures a partial discharge based upon the waveform of a voltage induced at the rotating electric machine 10 and diagnoses the insulation conditions in the rotating electric machine 10, i.e., the remaining service life of the rotating electric machine 10 based upon the measurement data. These insulation diagnosis methods will be described in detail later. A GPS receiver 16 and an Internet line 17 are connected to the control/data processing device 6. The control/data processing device 6 is thus able to indirectly obtain weather condition data indicating the temperature, the humidity, the atmospheric pressure and the like at the current vehicle position.

The test voltage applied to the rotating electric machine 10 when measuring a partial discharge occurring in the rotating electric machine 10 may be the inverter pulse voltage generated at the inverter power source 7, the induced voltage generated as the rotating electric machine 10 rotates, or a test voltage (a pulse voltage, a sine wave voltage or the like) applied to the rotating electric machine 10 via the external power terminal 17. The partial discharge measurement is executed in conjunction with the inverter pulse voltage provided from the inverter power source 7 as described below. The DC-DC converter 71 is configured to output a DC voltage higher than the rated voltage for regular operation and an inverter pulse voltage higher than the inverter pulse voltage for the regular operation is generated via the inverter 73. The high-level inverter pulse voltage thus generated is applied to the rotating electric machine 10. It is to be noted that this measuring method requires the inverter power source 7 to have a voltage withstanding level higher than the test voltage. Through the partial discharge measurement executed by using the inverter pulse voltage, a partial discharge occurring in an insulated area between windings or between phases at the rotating electric machine 10, or as an insulated area between the rotating electric machine 10 and the ground can be measured.

The partial discharge measurement is executed in conjunction with the voltage induced at the rotating electric machine 10 as described below. Namely, the rotating electric machine 10 is engaged in operation at a rotation speed higher than the rotation speed for regular operation under weak field control executed for the rotating electric machine 10 via the inverter 73. Then, while sustaining this condition, the weak field operation is switched to strong field operation so as to boost the voltage induced at the rotating electric machine 10. This measuring method, too, requires the inverter power source 7 to assure a voltage withstanding level equal to or higher than the test voltage. The induced voltage used in the partial discharge measurement has a sinusoidal waveform. This means that while a partial discharge occurring in an insulated area between phases and between the rotating electric machine 10 and the ground can be measured, a partial discharge occurring in an insulated area between windings cannot be measured through this measuring method, since a significant potential difference does not arise between the windings.

The partial discharge measurement is executed in conjunction with the test voltage provided from the external power source 14 by opening (turning off) the circuit breaker 11 and connecting the external power source 14 to the external power terminal 17 so as to generate a pulsed or sinusoidal test voltage at the external power source 14. With a pulsed test voltage, a partial discharge occurring in an insulated area between windings, between phases and between the rotating electric machine 10 and the ground can be measured, whereas a partial discharge occurring in an insulated area between phases or between the rotating electric machine 10 and the ground can be measured in conjunction with a test voltage assuming the sinusoidal waveform. The partial discharge measurement is executed in conjunction with the test voltage provided from the external power source 14 by opening the circuit breaker 11 and thus disconnecting the external power source 14 and the rotating electric machine 10 from the inverter power source 7. This means that the measuring method does not require the inverter power source 7 to assure a voltage withstanding level equal to or higher than the test voltage and that the measuring method can thus be adopted in conjunction with an inexpensive inverter power source 7.

By sustaining the internal atmospheric pressure at a low level in the rotating electric machine 10, a partial discharge can be measured with a low test voltage. Through the partial discharge measurement, executed by connecting the vacuum pump 15 to the external piping and the valve 16 mentioned earlier and sustaining a low internal atmospheric pressure in the rotating electric machine 10, a partial discharge can be measured with a test voltage equal to or lower than the drive voltage for regular operation. This partial discharge measurement at low atmospheric pressure can be executed by adopting any of the three partial discharge measuring methods described above without requiring an inverter power source 7 or an external power source 14 assuring a high voltage withstanding level.

FIGS. 1(*b*) through 1(*d*) show partial discharge measurement data 61, 62 and 63 stored in the memory 6*b* of the control/data processing device 6. The measurement data 610 in FIG. 1(*b*) are measurement data obtained by the control/data processing device 6 by executing partial discharge measurement with the inverter pulse voltage, whereas measurement data 616 in FIG. 1(*b*) are measurement data obtained through partial discharge measurement executed in conjunction with the voltage induced at the rotating electric machine 10. A partial discharge signal obtained through the partial discharge measurement executed by using the inverter pulse voltage may still retain noise attributable to a steep change in the pulse voltage even after it passes through the high pass filter 52. For this reason, the DC power voltage at the inverter 73 is adjusted in advance by controlling the DC-DC converter 71 in the inverter power source 7 so as to ensure that the level of the voltage initially applied to the rotating electric machine 10 never exceeds 300 v, i.e., the minimum sparking voltage in Paschen's law, and an inverter pulse voltage 611 generated by turning on/off the DC power via the inverter 73 is applied to the rotating electric machine 10 in the embodiment. At this time, the partial discharge measuring unit 5 measures an inverter pulse noise signal 612 which is not attributable to any partial discharge. After recording this inverter pulse noise signal 612, the voltage at the DC-DC converter 71 is gradually boosted until a voltage level equal to or higher than the regular operating voltage for the rotating electric machine 10 is achieved. As a result, a high inverter pulse voltage 613 is achieved and also a higher-level inverter pulse noise signal 614 is generated. At the same time, a partial discharge signal 615 is also generated at a different phase. Subsequently, as the voltage is further raised, the level of the partial discharge signal 615 rises drastically and PD (partial discharge) signal strength characteristics 62 relative to the applied voltage, such as those shown in FIG. 1(*c*) are achieved. This method achieved in the embodiment allows the partial discharge measurement for the rotating electric machine 10 to be executed by actually applying an inverter pulse voltage to the rotating electric machine 10. Thus, an insulation diagnosis can be executed by measuring any partial discharge, which would adversely affect the inverter drive, occurring in insulated areas between windings and between phases at the rotating electric machine 10 and in insulated areas between the rotating electric machine 10 and the ground.

However, if the design of the DC-DC converter 71 imposes specific limits and thus a high-level test voltage cannot be generated or if the inverter power source does not include a built-in DC-DC converter 71, a voltage equal to or higher than the regular operating voltage cannot be applied to the rotating electric machine 10. Under such circumstances, the atmospheric pressure inside the rotating electric machine 10 should be lowered with the vacuum pump 15 via the external piping and the valve 16 installed in advance at the rotating electric machine 10. Through these measures, the partial discharge inception voltage can be adjusted to a relatively low level only during the test and thus, a partial discharge can be measured at a low test voltage without having to raise the voltage applied to the rotating electric machine 10.

In the partial discharge measurement executed by using the voltage induced at the rotating electric machine 10, an induced voltage 617 with a sinusoidal waveform is generated at the rotating electric machine 10 while it rotates as indicated by measurement data 616 in FIG. 1(*b*), obtained through induced voltage-based partial discharge measurement. As the rotation speed of the rotating electric machine 10 increases, the induced voltage 618, too, becomes higher, resulting in generation of a partial discharge signal 619. Subsequently, as the induced voltage 618 rises to an even higher level, PD signal strength characteristics 62 such as those shown in FIG. 1(*c*) relative to the induced voltage are achieved with a partial discharge signal 619 at a much higher level. The partial discharge measuring unit 5 removes the induced voltage signal with the sinusoidal waveform from the signal output from the partial discharge measuring sensor 4 and thus extracts the partial discharge signal 619.

In this measuring method, the control/data processing device 6 executes partial discharge measurement by using the induced voltage 617/618 with the sinusoidal waveform as the test voltage and thus, any partial discharge occurring in an area between windings at the rotating electric machine 10 cannot be measured, as explained earlier. However, upon measuring a partial discharge in conjunction with the inverter pulse voltage 611/613, partial discharge measurement may also be executed through the induced voltage-based measuring method so as to identify the type of particular partial discharge, i.e., the partial discharge can be identified as a partial discharge occurring in an insulated area between phases or between the rotating electric machine 10 and the ground or as a partial discharge occurring in an insulated area between windings. By combining the induced voltage-based measuring method as described above, an advantage is achieved in that a specific location where the insulation conditions have deteriorated in the rotating electric machine 10 can be identified and optimal corrective measures can be taken accordingly.

In the description of the embodiment given above, the inverter pulse voltage-based partial discharge measurement and the induced voltage-based partial discharge measurement are executed simultaneously. However, the control/data processing device 6 may execute the inverter pulse voltage-based partial discharge measurement and the induced voltage-based partial discharge measurement at separate times and then executes an insulation diagnosis by analyzing the partial discharge measurement data having been obtained through the separate partial discharge measurements.

The PD signal strength characteristics 62 relative to the applied voltage or the induced voltage, having been determined through the measurement executed as described above, undergo changes as time elapses following the operation start of the rotating electric machine 10 and manifest as initial-stage characteristics 621, middle-stage characteristics 622 and late-stage characteristics 623, as indicated in FIG. 1(*c*). The leading edge voltages in the initial-through late-stage PD signal strength characteristics 621 through 623, i.e., their partial discharge inception voltages (PDIVs) taken in the various PD signal strength characteristics, respectively assume an initial-stage value PDIV1, a middle-stage value PDIV2 and then to a late-stage value PDIV3, indicating that the partial discharge inception voltage gradually decreases as time elapses following the operation start of the rotating electric machine 10. Accordingly, the control/data processing device 6 ascertains how the PDIV changes over time by measuring the initial-stage value PDIV1, the middle-stage value PDIV2 and the late-stage value PDIV3 corresponding to the varying lengths of time having elapsed following the operation start at the rotating electric machine 10.

At this time, the control/data processing device 6 converts the PDIV measurement data to PDIV corresponding to specific environment conditions, e.g., a temperature of 27° C., a relative humidity of 50% and an atmospheric pressure of 1013 hPa by correcting the PDIV measurement data based upon the temperature, the humidity and the atmospheric pressure at the rotating electrical machine 10 having been measured in advance, and PDIV dependency data indicating the PDIV dependency to these environment conditions stored in a PDIV dependency database. As a result, a PDIV graph 63 (see FIG. 1(*d*)) indicating the PDIV relative to the length of time of operation, which reflects the insulation deterioration characteristics alone, unaffected by load conditions or environment conditions, is obtained. The control/data processing device 6 compares the PDIV deterioration curve in the graph 63 thus obtained with PDIV deterioration curves attributable to insulation deterioration, stored in advance in a database, and determines the curve that best fits the PDIV a deterioration curve in the graph 63. The point at which the line extrapolated from the curve crosses the regular operating voltage (the drive voltage on which the rotating electric machine 10 is engaged in regular operation) indicates the end of the service life of the rotating electric machine 10. In addition, the block between the current PDIV (PDIV 3) and the service life end represents the remaining service life of the rotating electric machine 10. A deterioration curve 633 dipping downward represents a PDIV greatly affected by thermal deterioration, a deterioration curve 631 cresting upward represents a PDIV greatly affected by mechanical deterioration, and a deterioration curve 632 between the deterioration curves 633 and 631 represents a PDIV equally affected by thermal deterioration and mechanical deterioration.

It is to be noted that, when executing the partial discharge measurement, the atmospheric pressure and the humidity inside the rotating electric machine 10 can be individually adjusted to predetermined values by delivering nitrogen gas into the rotating electric machine 10 via the external piping and the valve 16 and that the temperature inside the rotating electric machine 10 can be set to a predetermined value by adjusting the temperature of the automatic transmission fluid in the hybrid electric vehicle. Furthermore, in addition to the PDIV deterioration curves attributable to the thermal deterioration and the mechanical deterioration described above, the control/data processing device 6 may also store in advance PDIV deterioration curves corresponding to oil resistance deterioration and hydrolysis resistance deterioration in a database and may predict the remaining service life by determining the curve that best fits the PDIV deterioration curve resulting from the measurement.

The method described above enables the control/data processing device 6 to diagnose the insulation conditions at the rotating electric machine 10 and more specifically, it allows the control/data processing device 6 to execute partial discharge measurement while the rotating electric machine 10 is engaged in operation. Analogous data obtained through the method in the related art tend to be greatly affected by the load conditions at the rotating electric machine 10 and the conditions in the environment of the rotating electric machine 10 and thus, specific deterioration tendencies cannot be identified with ease. The partial discharge measurement executed by the control/data processing device 6 in the embodiment is unique in that it directly or indirectly measures the temperature, the humidity and the atmospheric pressure at the rotating electric machine 10 and corrects the PDIV measurement data accordingly so as to provide reliable insulation diagnosis and a reliable remaining service life forecast without being readily affected by factors such as the load conditions and the environment conditions.

It is to be noted that the external piping and the valve 16 used to achieve a connection with the vacuum pump 15 and the external power terminal 17, via which connection with the external power source 14 is achieved, are disposed in advance at the rotating electric machine 10 in the embodiment, as has been described earlier (see FIG. 1(*a*)). This means that the control/data processing device 6 is able to execute diagnosis for the rotating electric machine 10 based upon the waveform of any test voltage provided from an external source for a regular inspection, e.g., a mandatory vehicle inspection, while controlling the environment conditions (the atmospheric pressure, the humidity and the temperature) at the rotating electric machine 10, as well as executing self diagnosis for the insulation conditions of the rotating electric machine 10 engaged in operation. The external piping and the valve 16 for vacuum pump connection and the external power terminal 17 for external power source connection, disposed at the rotating electric machine 10 in the embodiment, are not provided at the rotating electric machine installed in an electric vehicle or a hybrid electric vehicle in the related art. Thus, insulation diagnosis cannot be executed during a regular inspection unless the rotating electric machine 10 is removed from the gearbox or the like. The external piping, the valve 16 and the external power terminal 17 mounted in advance at the rotating electric machine 10 in the embodiment as described above assure easy access to the rotating electric machine 10 and thus enable insulation diagnosis during a mandatory vehicle inspection.

(Partial Discharge Measuring Method 1)

Figure 2:
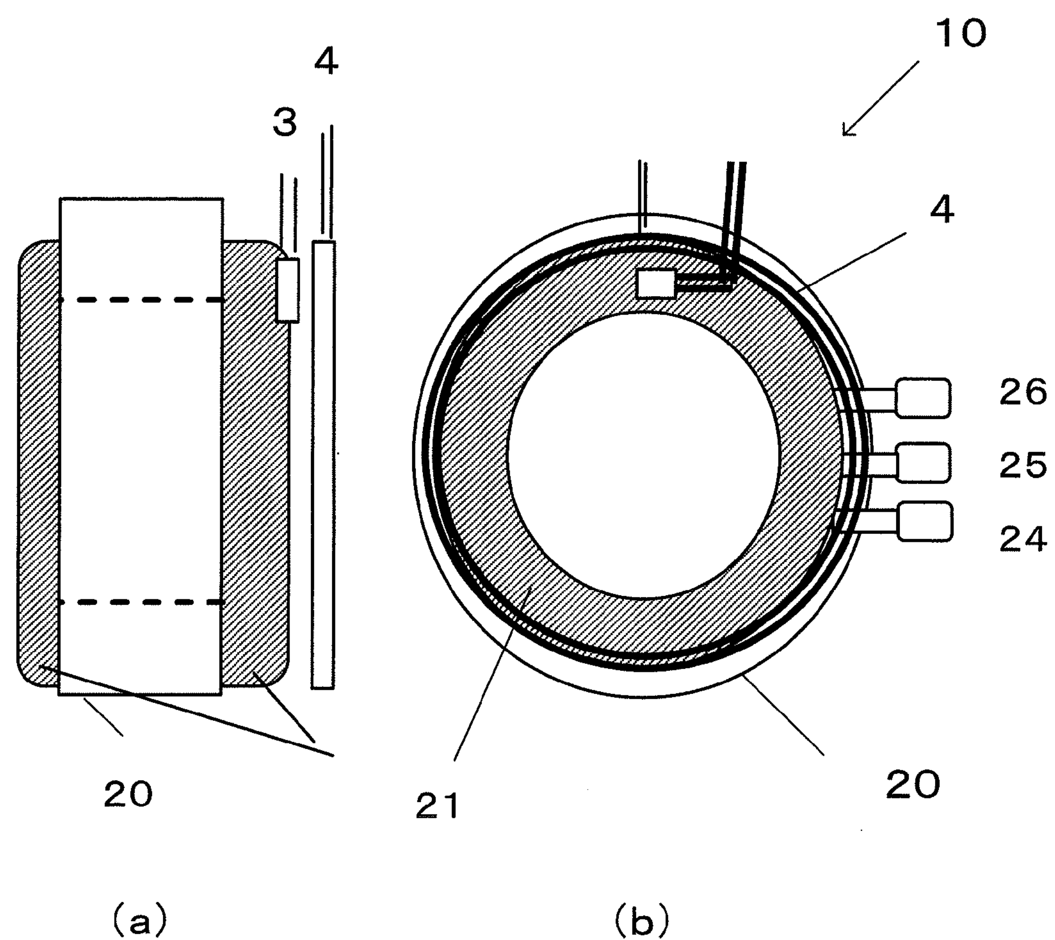

FIG. 2 shows the structures of the partial discharge measuring sensor 4 and the temperature sensor 3 and the positions at which they are mounted. FIG. 2(*a*) shows a stator core 20 in the rotating electric machine 10 (see FIG. 1(*a*)) and coil ends 21 of the stator winding (stator coil) in a side elevation. FIG. 2(*b*) is a front view of the stator core 20 and a coil end 21 taken on the side where lead wires (terminals) 24 through 26, each corresponding to one of the three phases U, V and W, are present. The length measured between the coil ends 21 along the axial direction (the left/right direction in FIG. 2(*a*)) is greater than the length measured at the stator core 20 along the axial direction (the left/right direction in FIG. 2(*a*)). The coil ends 21 project out to the left and to the right along the axial direction beyond the stator core 20 of the rotating electric machine 10. In other words, the rotating electric machine 10 adopts a structure that includes the two coil ends 21 facing opposite each other along the axial direction, set further outward along the axial direction relative to the two ends of the stator core 20 facing opposite each other along the axial direction. The temperature sensor 3 is attached onto a coil end surface where the temperature of the stator coil in the rotating electric machine 10 is assumed to rise to the highest level. The temperature sensor 3 may be constituted with a thermistor that includes a semiconductor element, a thermocouple, a platinum temperature measurement resistor, or the like.

The partial discharge measuring sensor 4, disposed in close proximity to the coil end 21 located on the side where the lead wires 24, 25 and 26 corresponding to the three phases U, V and W are present, is wound around the entire circumferential edge of the stator core 20. This positional arrangement makes it possible to measure a partial discharge occurring at any location in the entire stator winding via the partial discharge measuring sensor 4. The partial discharge measuring sensor 4 is constituted with an electrically conductive wire capable of functioning as an antenna that measures electromagnetic waves in a megahertz through gigahertz range. It is to be noted that the partial discharge measuring sensor 4 may instead be disposed at the coil end 21 located on the side opposite from the side where the lead wires corresponding to the three phases U, V and W are present. In addition, the lead wires 24 through 26 are terminals via which power is exchanged between the inverter power source 7 and the rotating electric machine 10 and are thus distinguishable from the external power terminal 17 via which power is exchanged with the external power source 14 mentioned earlier.

FIG. 3 shows the frequency band characteristics of the partial discharge measuring sensor 4. The dotted line in the figure represents a frequency spectrum 122 of the maximum inverter pulse noise manifesting when a maximum test voltage is applied, whereas the solid line in the figure represents a frequency spectrum 121 of the minimum partial discharge signal that can be detected. The high pass filter 52 in the partial discharge measuring unit 5 in the embodiment allows a higher frequency component 123 above a cutoff frequency f ca, set at the intersection point at which the frequency spectrum 122 of the inverter pulse noise and the frequency spectrum 121 of the minimum partial discharge signal intersect each other, to be passed through (see FIG. 1(*a*)). This means that the control/data processing device 6 is able to measure any partial discharge and diagnose the insulation conditions even in conjunction with the inverter pulse voltage by assuring the required level of partial discharge detection sensitivity. It is to be noted that by configuring the partial discharge measuring sensor 4 with a sensor achieving cutoff frequency characteristics matching those of the high pass filter, an even higher S/N ratio can be achieved for the partial discharge signal and the inverter pulse noise.

The partial discharge signal may be separated from the inverter pulse noise based upon the phase difference between the inverter pulse noise 614 and the partial discharge signal 615, as shown in FIG. 1(*b*), instead of through the high pass filter 52, as described above. As the data 610 in FIG. 1(*b*) obtained by executing the partial discharge measurement with the inverter pulse voltage indicate, the inverter pulse noise 614 occurs synchronously with the leading edge and the trailing edge of the inverter pulse voltage 613. The phase at which the partial discharge signal 615 is generated, however, does not match the phase at which the inverter pulse noise 614 occurs. Accordingly, a signal generated at a phase different from the phase at which the inverter noise 614 is expected to occur can be measured as the partial discharge signal 615.

(Partial Discharge Measuring Method 2)

FIG. 4 shows partial discharge measuring sensors 4*a* and 4*b* achieved in a variation, configured as two separate parts of a two-piece partial discharge measuring sensor set, one disposed by a coil end 21 on one side and the other disposed by the coil end 21 on the opposite side. FIG. 4(*a*) shows the stator core 20 and the coil ends 21 of the stator winding in a side elevation. FIG. 4(*b*) is a front view of the stator core 20 and a coil end 21 taken on the side where lead wires 24 through 26, each corresponding to one of the three phases U, V and W, are present. One of the partial discharge measuring sensors in this variation, i.e. the partial discharge measuring sensor 4*a*, disposed in close proximity to the coil end 21 located on the side opposite from the side where the lead wires 24, 25 and 26 corresponding to the three phases U, V and W are present, is wound around the entire circumferential edge of the stator core 20 in order to measure a partial discharge occurring at any location in the entire stator coil. The other partial discharge measuring sensor 4*b*, disposed in close proximity to the coil end 21 located on the side where the lead wires 24, 25 and 26 corresponding to the three phases U, V and W are present, is wound around the entire circumferential edge of the stator core 20 in order to measure a partial discharge occurring at any location in the entire stator coil. The partial discharge measuring sensor 4*a* located on the side opposite from the lead wire side and the partial discharge measuring sensor 4*b* located on the lead wire side are connected in series. As a result, the inverter pulse noise can be further reduced and the control/data processing device 6 is able to measure the partial discharge signal with a higher level of sensitivity. It is to be noted that since the temperature is measured via the temperature sensor 3, as has been described in reference to FIG. 2, a repeated explanation is not provided.

Figure 5:
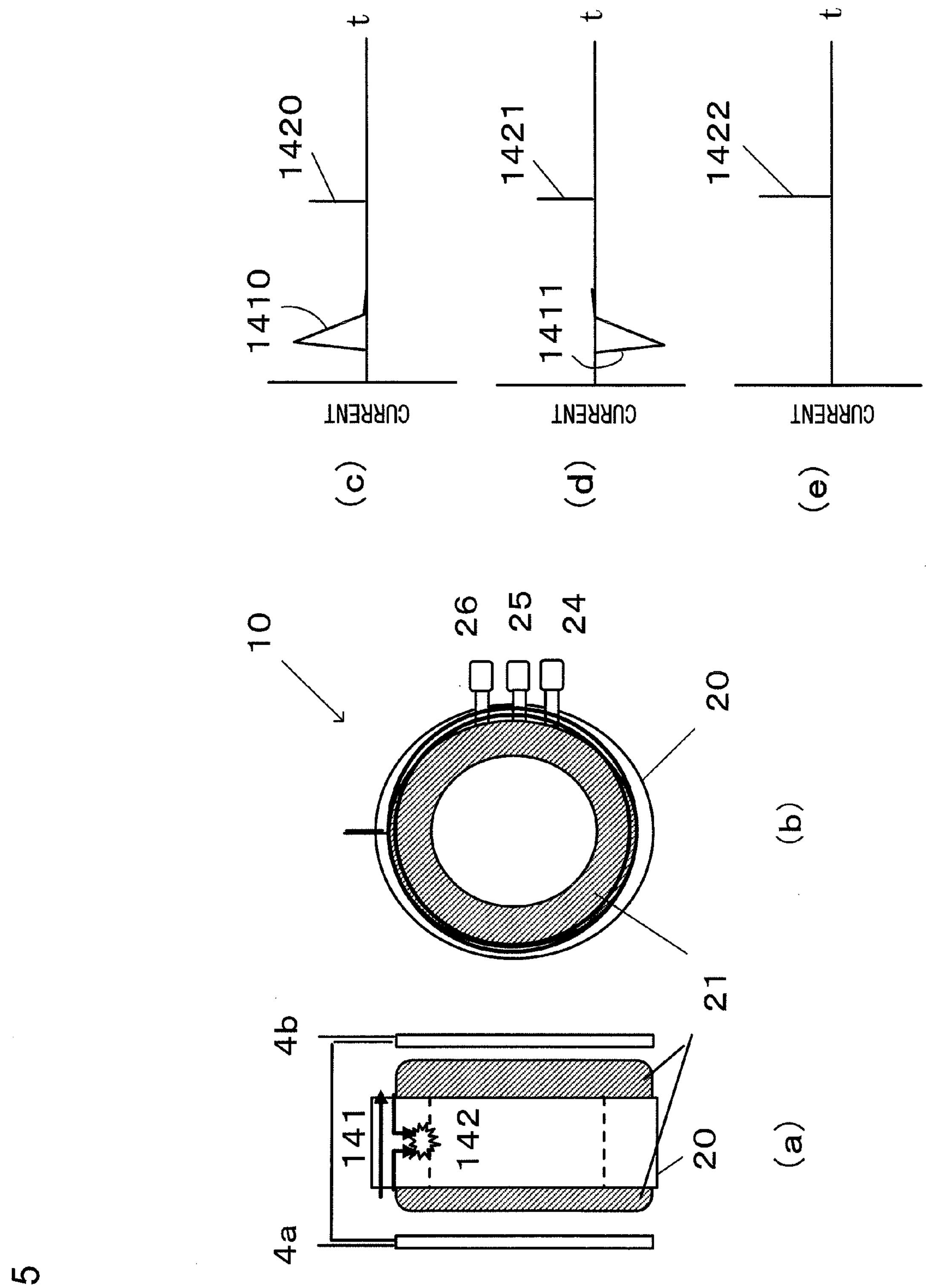

FIG. 5 illustrates the principle of measurement achieved in conjunction with the partial discharge measuring sensors 4*a* and 4*b* in the variation shown in FIG. 4. It is to be noted that FIG. 5 does not include an illustration of the temperature sensor 3. The electric current of an inverter pulse voltage flows in one direction from left to right (or from right to left) along the axis of the rotating electric machine 10, as indicated by an arrow 141 in FIG. 5(*a*). Thus, currents 1410 and 1411 of inverter pulse voltages flowing through the partial discharge measuring sensors 4*a* and 4*b* disposed so as to face opposite each other by matching their polarities, assume opposite polarities, as indicated in FIGS. 5(*c*) and 5(*d*). Currents 1420 and 1421 flowing through the partial discharge measuring sensors 4*a* and 4*b* in the event of a partial discharge, however, both flow toward the partial discharge location and thus assume matching polarities. This means that by connecting the partial discharge measuring sensors 4*a* and 4*b* in series, the currents 1410 and 1411 of the inverter pulse voltages cancel each other out and thus dissipate, whereas the currents 1420 and 1421 of the partial discharge are added together and integrated into a greater current 1422. The partial discharge can be measured with higher sensitivity with the discharge measuring sensors 4*a* and 4*b* in the variation, compared to the level of partial discharge measurement sensitivity assured with the discharge measuring sensor 4 shown in FIG. 2.

(Partial Discharge Measuring Method 3)

There is an issue to be addressed in the partial discharge measurement executed in the related art for a high-voltage rotating electric machine by utilizing a temperature sensor, in that a great change of impedance occurs at the temperature sensor as the temperature of the rotating electric machine changes steeply. This is bound to result in a significant change in the partial discharge measurement sensitivity. For this reason, the partial discharge measuring methods 1 and 2, having been described in reference to FIGS. 1 through 5 employ separate sensors, i.e., the temperature sensor 3 and the partial discharge measuring sensor 4. However, there is an urgent need for miniaturization, lighter weight and fewer components in the electric/hybrid electric vehicle industry. In order to fulfill this need, the temperature sensor may be modified so as to devise a temperature sensor capable of measuring partial discharges occurring in an electric vehicle or a hybrid electric vehicle subjected to significant load fluctuations or temperature changes.

FIG. 6 shows a configuration that includes a temperature sensor 41 used to measure partial discharges. This measuring method requires a capacitor 42 to be connected in parallel to the temperature sensor 41 that measures the temperature at the rotating electric machine 10. The capacitor 42 is disposed near the temperature sensor 41. The temperature sensor 41 (hereafter referred to as the temperature sensor/partial discharge measuring sensor 41) with the capacitor 42 connected thereto, is connected to the partial discharge measuring unit 5, as shown in FIG. 6, and is also connected to a temperature measurement port of the control/data processing device 6 shown in FIG. 1(*a*). At the temperature sensor 41, which is normally constituted with a semiconductor element such as a thermistor, a thermocouple, a temperature measuring resistor or the like having significant temperature dependency, the impedance or the terminal voltage changes greatly as the temperature changes. This gives rise to an issue in that, as a further improvement is achieved in the temperature measurement sensitivity, partial discharge measurement sensitivity is bound to be affected to a greater extent by the temperature changes. The capacitor 42 is connected in parallel to the temperature sensor 41 used in this partial discharge measuring method. Thus, the temperature sensor 41 outputs a temperature measurement signal and so functions as a temperature sensor as the temperature changes over time with a low-frequency in the millisecond to minute order. However, if a change occurs in a high-frequency range in the megahertz through gigahertz range to indicate a partial discharge signal, the two ends of the temperature sensor 41 become short-circuited via the capacitor 42, thereby allowing the temperature sensor 41 to function as a partial discharge measuring sensor. As a result, the temperature sensor 41 can be used for partial discharge measurement even for the rotating electric machine 10 installed in an electric vehicle or a hybrid electric vehicle, which is bound to be subjected to significant load fluctuations and temperature changes.

Figure 7:
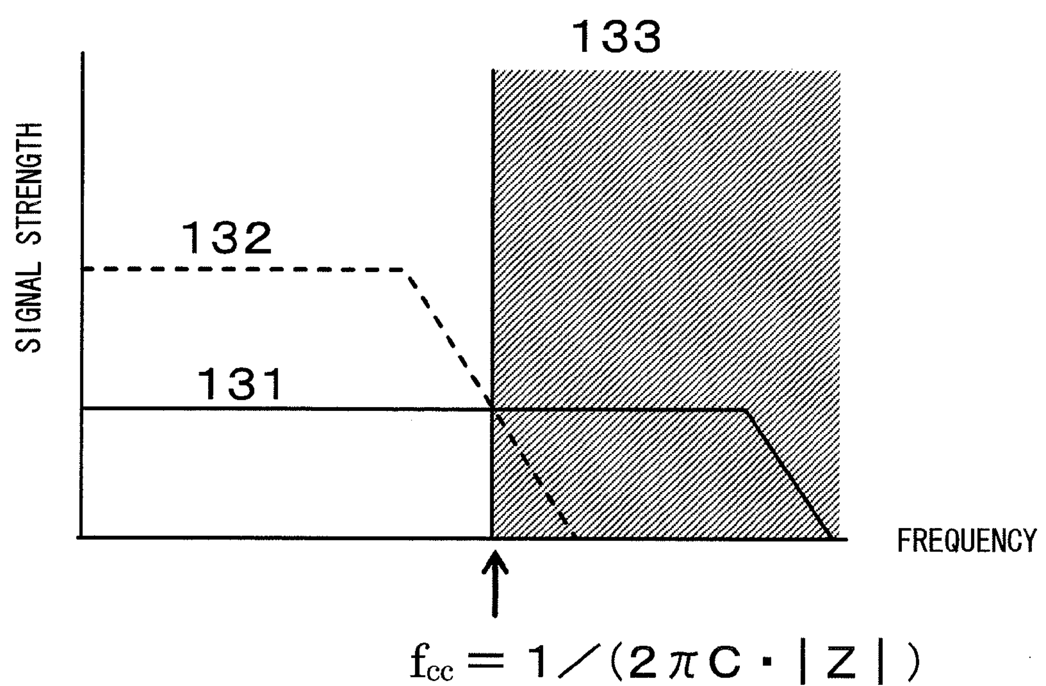

FIG. 7 indicates the frequency characteristics manifesting during a partial discharge measurement executed in conjunction with the temperature sensor/partial discharge measuring sensor 41 shown in FIG. 6. The dotted line in the figure represents a frequency spectrum 132 of the maximum inverter pulse noise manifesting when the maximum test voltage is applied, whereas the solid line in the figure represents a frequency spectrum 131 of the minimum partial discharge signal that can be detected. The frequency at the intersection point, at which the frequency spectrum 132 of the inverter pulse noise and the frequency spectrum 131 of the minimum partial discharge signal intersect each other, is designated as a cutoff frequency f cc. In the measuring method achieved in conjunction with this temperature sensor 41, an electrostatic capacity C of the parallel capacitor 42 and an impedance |Z| of the signal detection unit 51 of the partial discharge measuring unit 5 are adjusted so as to allow frequencies in a higher range 133 relative to the cutoff frequency f cc to be passed through. This means that the control/data processing device 6 is able to measure any partial discharge and diagnose the insulation conditions even in conjunction with the inverter pulse voltage by assuring the required level of partial discharge detection sensitivity.

FIG. 8 indicates the relationship between the admittance of the temperature sensor/partial discharge measuring sensor 41 in FIG. 6 and the admittance of the capacitor 42 also shown in FIG. 6. In the partial discharge measuring method achieved in conjunction with the temperature sensor 41 shown in FIG. 6, the frequency f cm at the intersection point at which the maximum admittance |Ytm| inherent to the temperature sensor 41 and the admittance |Yc| of the capacitor 42 connected in parallel to the temperature sensor 41 intersect each other, is set equal to or less than f cc. As a result, the admittance of the capacitor 42 is greater than the admittance of the temperature sensor 41 and thus the two ends of the temperature sensor 41 are short-circuited via the capacitor 42 in a high-frequency band (≥f cc), in which the partial discharge measurement is executed. For this reason, the control/data processing device 6 is able to measure partial discharges in a stable manner without being affected by the temperature characteristics of the temperature sensor 41.

More specifically, when f cc=100 MHz and the input impedance at the signal detection unit 51 of the partial discharge detector 5, including that of the DC cutoff integrated capacitor, is 150Ω at f cc=100 MHz, C is calculated to be 10 pF based upon the expression provided in FIG. 8. The admittance |Yc| characteristics in FIG. 8 can be determined in correspondence to the electrostatic capacity thus calculated. The maximum admittance |Ytm| inherent to the temperature sensor 41, which will allow the frequency f cm at the intersection point where |Ytm| and |Yc| intersect each other to be equal to or lower than f cc, can then be calculated as; |Ytm|≤2·f cc·C=0.006·S. The temperature sensor 41 with such a maximum admittance should be employed to measure both the temperature and partial discharges, as shown in FIG. 6. It is to be noted that the numerical values quoted above simply represents an example and that the control/data processing device 6 is capable of measuring the temperature and partial discharges via the temperature sensor 41 by adopting another circuit constant optimized as described above.

(Partial Discharge Measuring Method 4)

FIG. 9 shows a configuration achieved in conjunction with the temperature sensor/partial discharge measuring sensor 41 in a variation. In the measuring method described in reference to FIG. 6, partial discharges are measured via the temperature sensor 41, the two ends of which are connected to the capacitor 42. In the example presented in FIG. 9, instead of connecting a capacitor, an electrostatic capacitance 500 is achieved at the temperature sensor 41 by fixing lead wires from the temperature sensor 41, set in close proximity and parallel to each other with a resin mold or the like (over the area indicated by reference number 500 in the figure). In the following description, the temperature sensor 41 with the electrostatic capacitance 500 added thereto will be referred to as a temperature sensor/partial discharge measuring sensor 41. The temperature sensor/partial discharge measuring sensor 41 is connected to the partial discharge measuring unit 5, as shown in FIG. 9, and is also connected to the temperature measurement port of the control/data processing device 6 shown in FIG. 1(*a*). While advantages similar to those described in reference to FIG. 7 are achieved through this measuring method, the measuring method differs from that shown in FIG. 6 in that it does not require the capacitor 42, thereby achieving added advantages in that the number of required parts is reduced and that the number of steps to be followed for the connection work is reduced.

Figure 10:
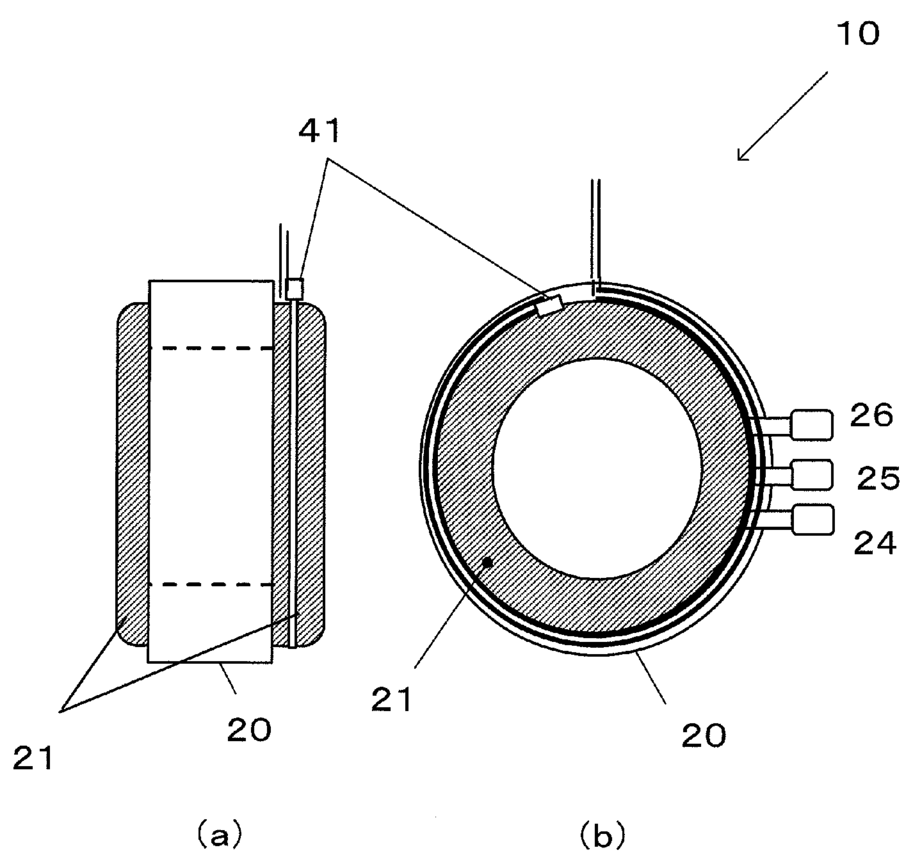

FIG. 10 shows how the temperature sensor/partial discharge measuring sensor 41 shown in FIG. 6 or FIG. 9 may be installed at the rotating electric machine 10. FIG. 10(*a*) shows the stator core 20 in the rotating electric machine 10 (see FIG. 1(*a*)) and the coil ends 21 of the stator winding in a side elevation. FIG. 10(*b*) is a front view of the stator core 20 and a coil end 21 taken on the side where lead wires 24 through 26, each corresponding to one of the three phases U, V and W, are present. The temperature sensor/partial discharge measuring sensor 41 is fixed onto the surface of the coil end where the temperature of the stator coil in the rotating electric machine 10 is expected to rise to the highest level. An output line of the temperature sensor/partial discharge measuring sensor 41, disposed near the coil end 21, is wound around the entire circumferential edge of the stator core 20. Through these measures, it is ensured that a partial discharge occurring at any location over the entire coil in the rotating electric machine 10 can be detected.

(Partial Discharge Measuring Method 5)

Figure 11:
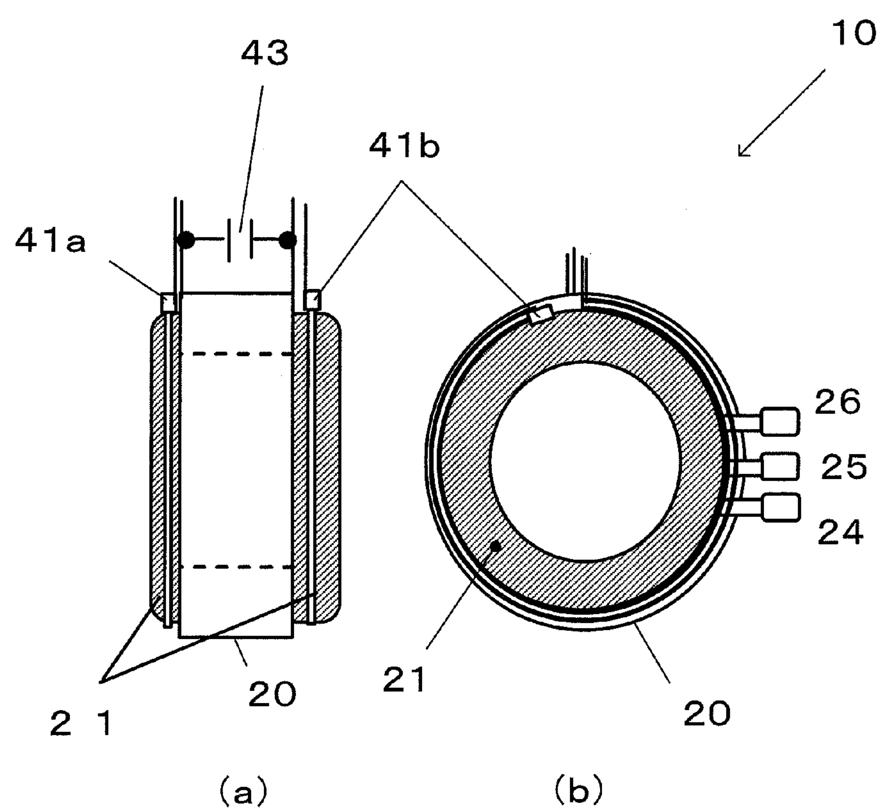

FIG. 11 shows a temperature sensor/partial discharge measuring sensor 41*a* and a temperature sensor/partial discharge measuring sensor 41*b* achieved in a variation, configured as two separate parts of a two-piece partial discharge measuring sensor set, one disposed by a coil end 21 on one side and the other disposed by the coil end 21 on the opposite side. FIG. 11(*a*) shows the stator core 20 in the rotating electric machine 10 (see FIG. 1(*a*)) and coil ends 21 of the stator winding in a side elevation. FIG. 11(*b*) is a front view of the stator core 20 and a coil end 21 taken on the side where lead wires 24 through 26, each corresponding to one of the three phases U, V and W, are present. The temperature sensor/partial discharge measuring sensor 41*a* and the temperature sensor/partial discharge measuring sensor 41*b*, respectively disposed near the left coil end 21 and the right coil end 21 located on the left side and the right side facing opposite each other along the axis of the rotating electric machine 10, are wound around the entire circumferential edge of the stator 20 in order to measure partial discharges occurring anywhere in the rotor coil. The temperature sensor/partial discharge measuring sensor 41*a* and the temperature sensor/partial discharge measuring sensor 41*b* are connected with each other via a capacitor 43. This configuration allows the temperature sensor/partial discharge measuring sensor 41*a* and the temperature sensor/partial discharge measuring sensor 41*b* to function as temperature sensors independently of each other while the temperature undergoes a low-frequency change over time in the order of milliseconds to minutes. However, if a change occurs in a high-frequency range in the megahertz through gigahertz range to indicate a partial discharge signal, the two ends of each of the two sensors, i.e., the temperature sensor/partial discharge measuring sensor 41*a* and the temperature sensor/partial discharge measuring sensor 41*b*, become short-circuited, thereby allowing them to function as partial discharge measuring sensors. By configuring a sensor unit as a two-piece sensor unit that includes two temperature sensors/partial discharge measuring sensors as described above, advantages similar to those described in reference to FIG. 5 of the configuration that includes two partial discharge measuring sensors 4*a* and 4*b* connected in series as shown in FIG. 4 are achieved and partial discharges can be measured with a higher level of sensitivity while keeping down the inverter pulse noise.

(Partial Discharge Measuring Method 6)

Figure 12:
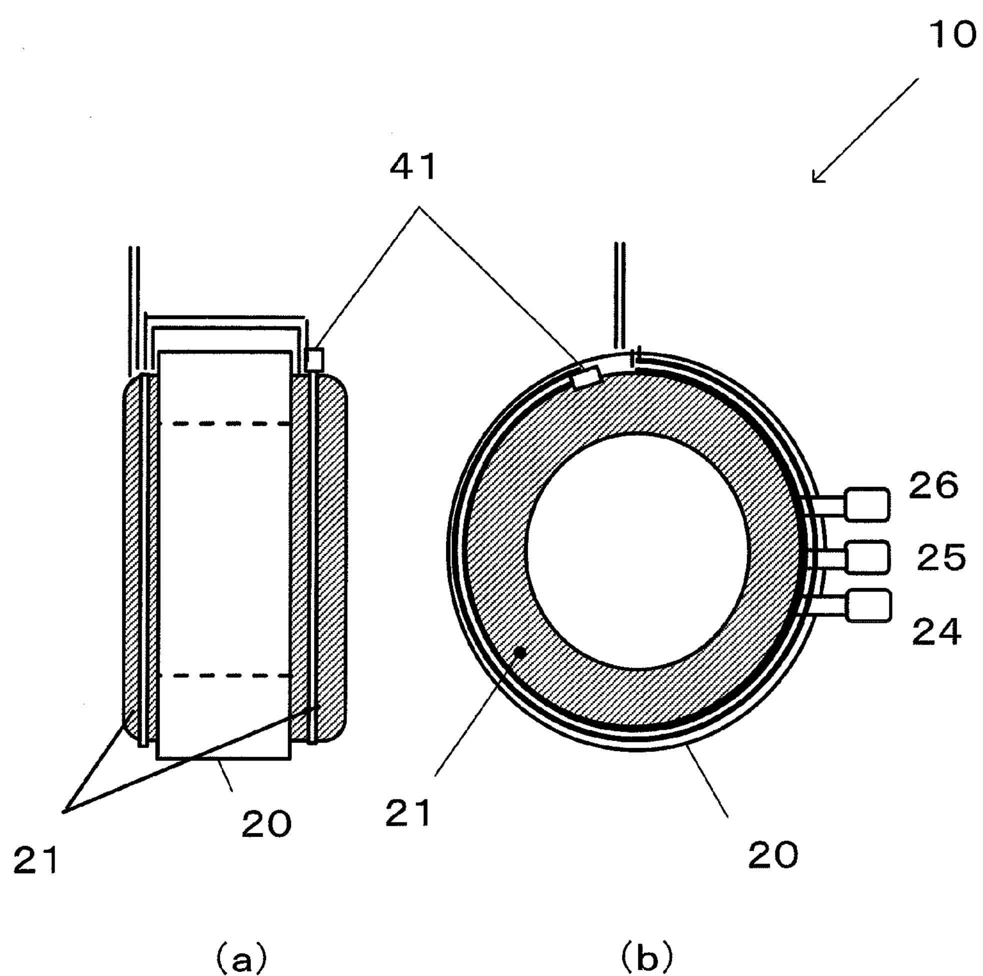

In the example presented in FIG. 12, the wiring of the temperature sensor/partial discharge measuring sensor 41 in FIG. 6 or FIG. 9 is led from one coil end 21 to another coil end 21. FIG. 12(*a*) shows the stator core 20 in the rotating electric machine 10 and the coil ends 21 of the stator winding in a side elevation. FIG. 12(*b*) is a front view of the stator core 20 and a coil end 21 taken on the side where lead wires 24 through 26 each corresponding to one of the three phases U, V and W, are present. The partial discharge measuring method 5 described earlier in reference to FIG. 11 is advantageous in that the temperature can be measured at two points via the two sensors, i.e. the temperature sensor/partial discharge measuring sensor 41*a* and the temperature sensor/partial discharge measuring sensor 41*b*. At the same time, the method requires two sensors, i.e., a greater number of components and further requires the capacitor 43 to connect the sensors 41*a* and 41*b* with each other. In the measuring method 6 shown in FIG. 12, the temperature is measured at a single point but the wiring of the single temperature sensor/partial discharge measuring sensor 41 is routed so as to extend continuously from the coil end 21 on one side to the coil end 21 on the other side. As a result, partial discharges can be measured with a higher level of sensitivity by minimizing the inverter pulse noise while keeping down the number of required parts.

(Other Partial Discharge Measuring Methods)

Figure 13:
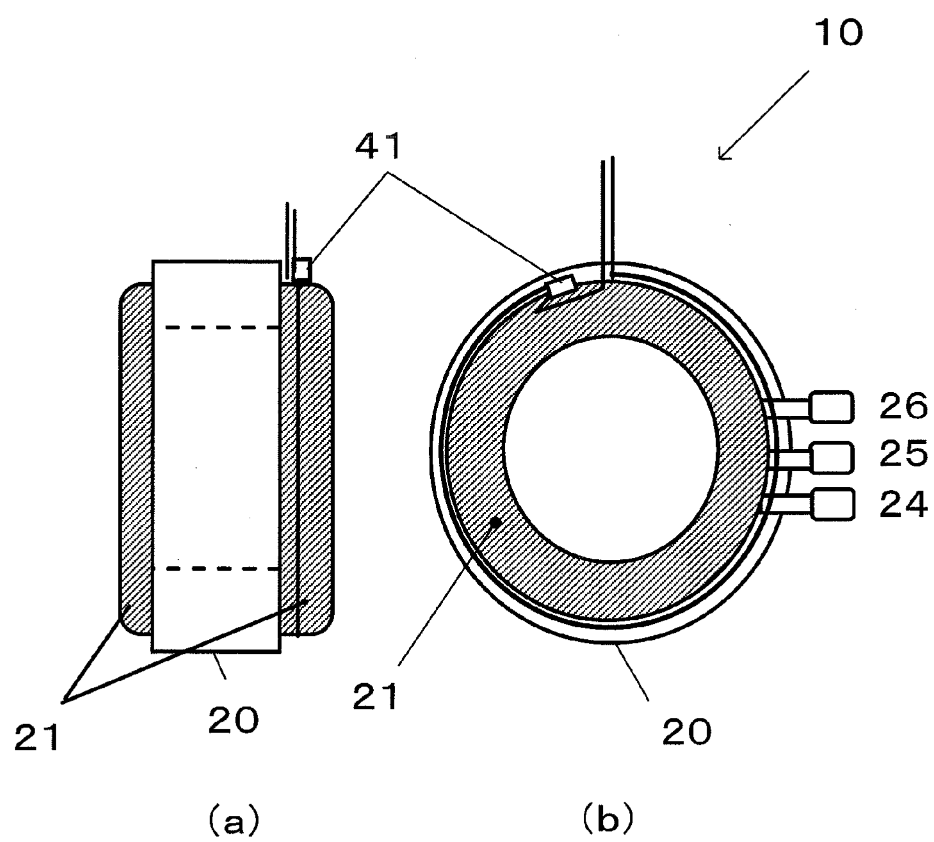
Figure 14:
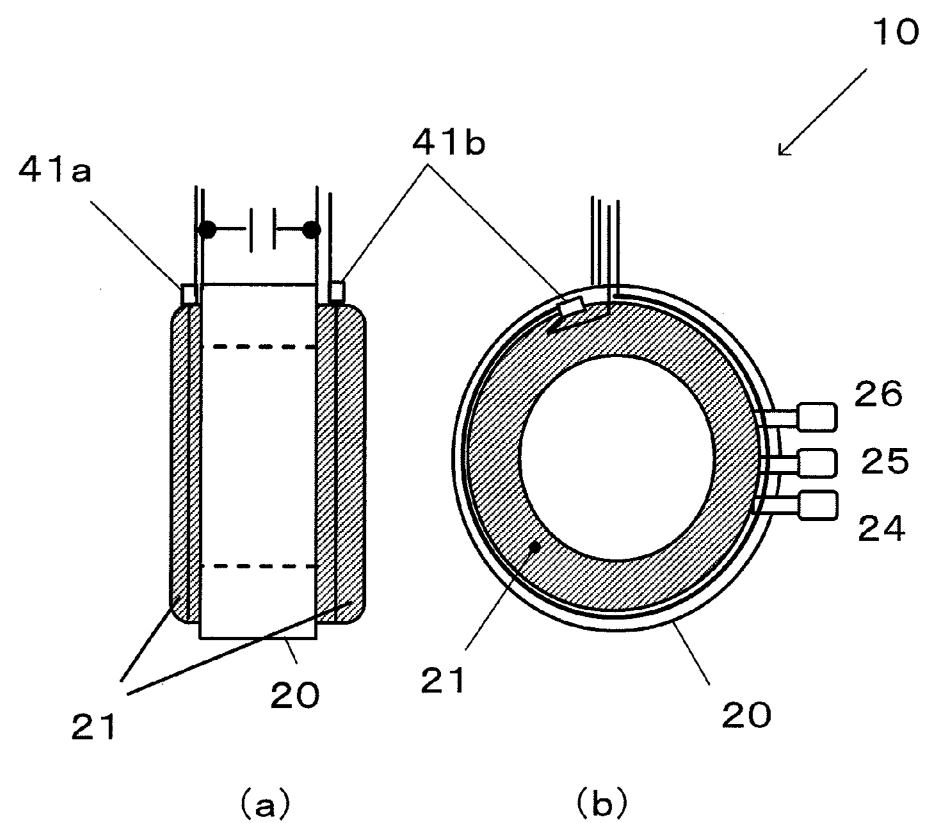

FIGS. 13 through 15 each present an example of a configuration achieved by winding one of the two wiring lines output from the temperature sensor/partial discharge measuring sensor 41 (the temperature sensor/partial discharge measuring sensor 41*a* and the temperature sensor/partial discharge measuring sensor 41*b*) in FIGS. 10 through 12 in the clockwise direction and winding the other wiring line in the counterclockwise direction along the circumference of the stator core 20. FIGS. 13(*a*), 14(*a*) and 15(*a*) in FIGS. 13 through 15 each show the stator core 20 in the rotating electric machine 10 and the coil ends 21 of the stator winding in a side elevation. FIGS. 13(*b*), 14(*b*) and 15(*b*) in FIGS. 13 through 15 each provide a front view of the stator core 20 and a coil end 21 taken on the side where lead wires 24 through 26, each corresponding to one of the three phases U, V and W, are present. In each of the examples presented in FIGS. 10 through 12, the two wiring lines from the temperature sensor/partial discharge measuring sensor 41 (the temperature sensor/partial discharge measuring sensor 41*a* and the temperature sensor/partial discharge measuring sensor 41*b*) are laid out parallel to each other, leading to a concern that a large electrostatic capacitance between the wiring lines may cause a partial discharge signal to leak over an area between the wiring lines to result in short-circuiting and thus necessitating thick insulation on the wiring lines. In contrast, FIGS. 13 through 15 each show an example in which the two wiring lines extending from the temperature sensor/partial discharge measuring sensor 41 (41*a*, 41*b*) are wound in different directions, i.e., in the clockwise direction and the counterclockwise direction, along the entire circumference of the stator core 20. As a result, any electromagnetic waves indicating a partial discharge, which propagate along the axis of the rotating electric machine 10, can be detected with a high level of efficiency while reducing the extent of electrostatic capacitance leak occurring between the wiring lines.

Advantages achieved by installing the rotating electric machine 10 for an electric vehicle and its drive control device in the embodiment structured as described above in an electric vehicle or a hybrid electric vehicle are described next. The waveform of the voltage applied to a rotating electric machine installed in an electric vehicle or a hybrid electric vehicle, the operating conditions under which the rotating electric machine is operated, the insulation system configured for the rotating electric machine and the structure of the rotating electric machine all greatly differ from those of a large, high-voltage rotating electric machine, as detailed in (1) through (5) below. This means that the insulation diagnosis method described earlier, adopted in conjunction with large, high-voltage rotating electric machines in the related art, will not work for the rotating electric machine installed in an electric vehicle or a hybrid electric vehicle. It is to be noted with particular emphasis that partial discharge measurement cannot be executed while the rotating electric machine is engaged in operation through the insulation diagnosis method in the related art.

(1) In the rotating electric machine driven via an inverter power source, a high voltage is applied to the insulator between different phases and the insulator between the windings, as well as to the insulator between the rotating electric machine and the ground.

(2) An excessively large current flows during acceleration or deceleration, causing an abrupt change in temperature.

(3) The rotating electric machine installed in a vehicle is bound to be engaged in operation under widely varying environment conditions.

(4) The rotating electric machine, manufactured by using an organic material with poor partial discharge deterioration resistance characteristics, cannot tolerate partial discharges.

(5) The rotating electric machine typically designed to constitute an integrated unit together with the gearbox and the like cannot be disengaged with ease once it is installed in the vehicle and thus insulation diagnosis cannot be executed with ease.

Furthermore, there are issues (1) through (5) outlined below and the like to be addressed when the rotating electric machine is driven via an inverter power source.

(1) The inverter pulse noise and the partial discharge signal cannot be distinguished from each other with ease.

(2) The impedance characteristics of the temperature sensor are bound to change greatly in response to a large change in temperature and thus, the partial discharge signal measurement sensitivity with which partial discharges are measured in conjunction with the temperature sensor fluctuates greatly, making it difficult to assure stable data measurement and reliable insulation diagnosis.

(3) At the rotating electric machine installed in a vehicle bound to be subjected to significant load fluctuations and temperature changes, the extent of change in the partial discharge characteristics attributable to load fluctuations and temperature changes will be greater than the extent of change in the partial discharge characteristics resulting from insulation deterioration, making it very difficult to accurately ascertain specific insulation deterioration tendencies.

(4) While the insulation deterioration tendency in the rotating electric machine can be roughly estimated based upon the results obtained by executing partial discharge measurement at a given slot, partial discharge measurement or insulation deterioration diagnosis is not actually executed over the whole rotating electric machine coil.

(5) The rotating electric machine is manufactured without using any material with superior partial discharge deterioration resistance characteristics. This means that once a partial discharge occurs, a breakdown will soon occur and that partial discharge measurement and insulation diagnosis need to be executed with a higher level of accuracy compared to the related art.

The issues of the insulation diagnosis method in the related art discussed above can be successfully addressed by adopting the rotating electric machine 10 for an electric vehicle and its drive control device achieved in the embodiment or in any of its variations as described above. Furthermore, the insulation conditions of the rotating electric machine for an electric vehicle driven via an inverter power source, can be diagnosed with ease and at low cost while the rotating electric machine is engaged in regular operation without having to disengage the rotating electric machine from the electric vehicle.

(An Example of a Structure that may be Adopted in the Rotating Electric Machine 10)

FIG. 16 shows the rotating electric machine 10 in a sectional view taken along the axial direction. The rotating electric machine 10 comprises a stator 150 and a rotor 151, disposed via an air gap on the inner circumferential side of the stator 150 and rotatably supported. The stator 150 and the rotor 151 are held inside a housing 152 of the rotating electric machine 10.

The stator 150 is constituted with a stator core 153 and a stator coil (stator winding) 154. The stator core 153 is formed by laminating thin steel sheets, which are first press-molded into a predetermined shape. The stator core 153 is made up with a circular yoke core and a plurality of tooth cores projecting out from the yoke core along the radial direction and set over equal intervals along the circumferential direction. The yoke core and the tooth cores are formed as an integrated unit. A plurality of slots, each constituted with an opening formed on the inner circumferential surface side of the stator core 153 over the inner circumferential area of the stator core 153, take up consecutive positions along the axial direction. The slots are each formed as a space inside a groove located between two consecutive tooth cores set next to each other along the circumferential direction. Forty-eight slots are formed in the embodiment. The stator coil 154 is wound at the tooth cores of the stator core 153 by adopting a distributed winding method. A coil adopting the distributed winding method is wound at the stator core 153 so that it is housed inside two slots set apart from each other by a plurality of slots present between them.

The stator coil 154 is configured with a U-phase stator coil, a V-phase stator coil and a W-phase stator coil, continuously wound while laminating coil conductors. The coils constituting the stator coil 154 are wound in advance at a winding frame in a predetermined sequence by using an automatic winding machine, are then inserted into slots 155 at the stator core 153 through entrances formed at the slots 155 by an automatic inserting machine and are thus wound around the stator core 153. The U-phase stator coil, the V-phase stator coil and the W-phase stator coil constituting the stator coil 154 are inserted at the slots in the order they are listed here. The coil end portions of the stator coil 154 project out of slots 155 on the two opposite sides along the axial direction at the two end surfaces of the stator core 153 facing opposite each other along the axial direction.

The rotor 151 is configured with a rotor core 156, permanent magnets 155 and a shaft 157. The rotor core 156, formed by laminating thin steel sheets one on top of another so as to achieve a predetermined shape through press-molding, is fixed to the shaft 157. In the outer circumferential area of the rotor core 156, a plurality of magnet insertion holes passing through the rotor core along the axial direction are formed over equal intervals along the circumferential direction. Eight magnet insertion holes are formed at the rotor core in the embodiment. A permanent magnet 155 is inserted and securely held in place at each permanent magnet insertion hole. The shaft 157 is rotatably supported via bearings 159F and 159R, at end brackets 158F and 158R, one fixed to one side and the other fixed to the opposite side of the housing 152.

(Structural Example of the Inverter 7)

FIG. 17 shows a circuit structure that may be adopted for an inverter unit INV used in a drive system for an electric vehicle or a hybrid electric vehicle. The inverter unit INV is constituted with two inverters INV1 and INV2. The inverters INV1 and INV2 are structurally identical to each other. The inverter INV1 and the inverter INV2 are each constituted with a power module PM and a driver unit DU. The driver unit DU is controlled by a motor control unit MCU. DC power originating from a battery BA is provided to the power modules PM and the inverters INV1 and INV2, which convert the DC power thus provided to AC power, provide the AC power resulting from the conversion to motor/generators FMG and RMG. In addition, when the motor/generators FMG and RMG are engaged in operation as generators, the outputs from the generators are converted, via the inverters INV1 and INV2, to DC power and the DC power resulting from the conversion is used to charge the battery BA after the voltage level is regulated via a DC-DC converter (not shown).

The power module PM in the inverter INV1, constituted with six arms, provides electric power, obtained by converting the DC power supplied from the battery BA used as an on-board DC power source to AC power, to the motor/generator FMG (the power module PM in the inverter INV2 likewise provides AC power to the motor/generator RMG) embodying the rotating electrical machine. Semiconductor switching elements constituted with IGBTs (insulated gate bipolar transistors) are used as the six arms in the power module PM. As an alternative to IGBTs, semiconductor switching elements constituted with MOSFETs (metal oxide semiconductor field effect transistors) designed for power conversion applications may be used.

The use of IGBTs is advantageous in that they assure higher operating speeds. In the past, a high-voltage inverter was always configured with IGBTs, since MOSFETs designed for power conversion applications could not be operated at high voltage. However, the level of operating voltage that power conversion MOSFETs can withstand has been raised significantly in recent years and thus, the vehicular inverters today can be configured by using either IGBTs or MOSFETs as semiconductor switching elements. The desirability of power conversion MOSFETs over IGBTs is their simpler semiconductor structure, which allows the semiconductors to be manufactured through fewer manufacturing steps.

FIG. 17 shows an upper arm and a lower arm corresponding to each of the three phases, i.e., the U-phase, the V-phase and the W-phase, connected in series. The collector terminals at the individual upper arms corresponding to the U-phase, the V-phase and the W-phase (the drain terminals at the upper arms constituted with power conversion MOSFETs) are all connected to the positive pole side of the battery BA. The emitter terminals at the individual lower arms corresponding to the U-phase, the V-phase and the W-phase (the source terminals at the lower arms constituted with power conversion MOSFETs) are all connected to the negative pole side of the battery BA.

A connecting point at which the emitter terminal of the U-phase upper arm (the source terminal of the U-phase upper arm constituted with a power conversion MOSFET) and the collector terminal of the U-phase lower arm (the drain terminal of the U-phase lower arm constituted with a power conversion MOSFET) are connected to each other, is connected to a U-phase terminal of the motor/generator FMG (or RMG) and thus, a U-phase current flows through the connecting point. If the armature winding (the stator winding of a permanent magnet synchronous motor) adopts a Y connection, the current at the U-phase winding will flow through the connecting point. A connecting point at which the emitter terminal of the V-phase upper arm (the source terminal of the V-phase upper arm constituted with a power conversion MOSFET) and the collector terminal of the V-phase lower arm (the drain terminal of the V-phase lower arm constituted with a power conversion MOSFET) are connected to each other, is connected to a V-phase terminal of a V-phase are mature winding (stator winding) at the motor/generator FMG (or RMG) and thus, a V-phase current flows through the connecting point. If the stator winding adopts a Y connection, the current at the V-phase winding will flow through the connecting point. A connecting point at which the emitter terminal of the W-phase upper arm (the source terminal of the W-phase upper arm constituted with a power conversion MOSFET) and the collector terminal of the W-phase lower arm (the drain terminal of the W-phase lower arm constituted with a power conversion MOSFET) are connected to each other, is connected to a W-phase terminal of the motor/generator FMG (or RMG). If the stator winding adopts a Y connection, the current at the W-phase winding will flow through the connecting point. As the DC power provided from the battery BA is converted to AC power and the AC power resulting from the conversion is supplied to the three-phase stator coils, i.e., the U-phase stator coil, the V-phase stator coil and the W-phase stator coil constituting the stator of the motor/generator FMG (RMG), the rotor is rotationally driven with magnetomotive force induced by the electric currents flowing through the three-phase stator coils.

A motor control unit MCU controls each driver unit DU that generates a gate signal and thus, the gate signal is provided to the semiconductor switching elements corresponding to each phase via the driver unit corresponding to the particular phase. The gate signal thus provided is used to control for an electrically continuous state or a discontinuous (cut off) state. The DC power is thus converted to three-phase AC power. Since the three-phase AC power generation technology is of the known art, a detailed description of the three-phase AC power generating operation is not provided.

(Structural Example of a Hybrid Electric Vehicle)

Figure 18:
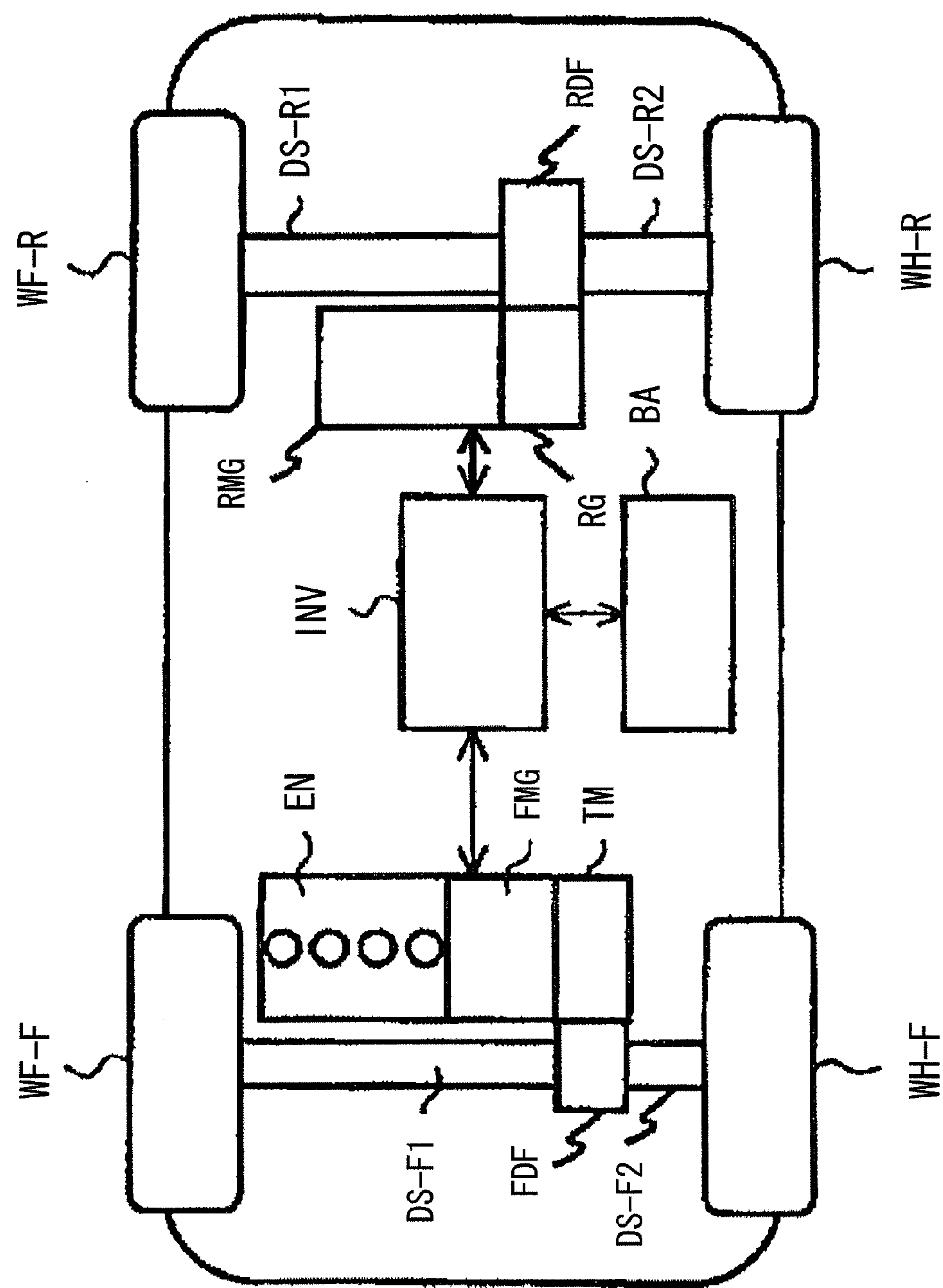

FIG. 18 shows a traveling drive system of a hybrid electric vehicle with rotating electric machines 10 such as that shown in FIG. 16 and the inverter system shown in FIG. 17 installed therein. The hybrid electric vehicle in FIG. 18 is a four-wheel drive vehicle with its front wheels WH-F driven with an engine EN, which is an internal combustion engine, and a front-side motor/generator FMG constituted with a rotating electric machine 10 structured as described earlier and its rear wheels WH-R driven with a rear-side motor/generator RMG constituted with a rotating electric machine 10. It is to be noted that the front wheels WH-F are driven with the engine EN and the front-side motor/generator FMG and the rear wheels WH-R are driven with the rear-side motor/generator RMG in this embodiment. As an alternative, the rear wheels WH-R may be driven with the engine EN and the front-side motor/generator FMG constituted with a rotating electric machine 10 such as described earlier and the front wheels WH-F may be driven with a rear-side motor/generator RMG.

A transmission TM is mechanically connected via a front-side differential FDF to a front wheel axle DS-F for the front wheels WH-F. The engine EN and the motor/generator MG are mechanically connected, via an output control mechanism (not shown), to the transmission TM. The output control mechanism (not shown) is a mechanism via which a combined rotational output is generated or the rotational output is distributed. The AC side of the inverter unit INV is electrically connected to the stator winding of the front-side motor/generator MG. The inverter unit INV, which is a power conversion device that converts a DC power to three-phase AC power, the drive of the motor/generators MG is controlled. The battery BA is electrically connected to the DC side of the inverter unit INV.

The rear-side motor/generator RMG is mechanically connected via a rear-side speed reducer RG, to rear wheel axles DS-R 1 and DS-R 2 for the rear wheels WH-R, to which a rear-side differential RDF is also mechanically connected. The AC side of the inverter unit INV is electrically connected to the stator winding of the rear-side motor/generator RMG. The inverter unit INV is a common inverter system shared by the front-side motor/generator FMG and the rear-side motor/generator RMG. The inverter unit INV includes a conversion circuit portion for the motor/generator MG, a conversion circuit portion for the rear-side motor/generator RMG, and a drive control portion via which the conversion circuit portions are driven.

When the hybrid electric vehicle is started up or is engaged in traveling operation at low speed (in a range over which the operational efficiency (fuel efficiency) of the engine EN is lower), the front-side motor/generator FMG drives the front wheels WH-F. It is to be noted that the embodiment is described by assuming that the front-side motor/generator FMG drives the front wheels WH-F when starting up the hybrid electric vehicle or engaging the hybrid electric vehicle in traveling operation at low speed. However, the present invention is not limited to this example and it may be adopted in a vehicle, the front wheels WH-F of which are driven by the front-side motor/generator FMG and the rear wheels WH-R of which are driven by the rear-side motor/generator RMG (i.e., a vehicle engaged in four-wheel drive operation). DC power originating from the battery BA is provided to the inverter unit INV. The DC power provided to the inverter unit INV is converted to three-phase AC power by the inverter unit INV. The three-phase AC power thus obtained is provided to the stator winding of the front-side motor/generator FMG. As the front-side motor/generator FMG is thus driven with the three-phase AC power, the front-side motor/generator FMG generates a rotational output. This rotational output is input to the transmission TM via the output control mechanism (not shown). The rotational output input to the transmission TM is altered at the transmission TM and the rotational output having undergone the speed change is then input to the differential FDF. The rotational output input to the differential FDF is divided at the differential FDF so that part of the rotational output is transmitted to the one of the front wheel axle DS-F near the front wheel WH-F and the remaining part is transmitted to the another front wheel axle DS-F near the front wheel WH-F. The front wheel axle DS-F is thus rotationally driven. As the front wheel axle DS-F is rotationally driven, the front wheels WH-F are also rotationally driven.

When the hybrid electric vehicle is engaged in regular traveling operation (i.e., on a dry road surface with the engine EN running in a range of good operational efficiency (fuel efficiency)), the front wheels WH-F are driven via the engine EN. Accordingly, the rotational output from the engine EN is input to the transmission TM via the output control mechanism (not shown) in this operational state. The rotational output input to the transmission TM undergoes a speed change at the transmission TM. The rotational output having undergone the speed change is then transmitted to the front wheel axle DS-F via the front-side differential FDF. The front wheels WH-F are rotationally driven with this rotational output. In addition, the state of charge in the battery BA is detected, and if it is determined that the battery BA needs to be charged, the rotational output of the engine EM is distributed to the front-side motor/generator FMG via the output control mechanism (not shown) in order to rotationally drive the front-side motor/generator FMG. As a result, the front-side motor/generator FMG is allowed to operate as a generator. Through the generator operation, three-phase AC power is generated at the stator winding of the front-side motor/generator FMG. The three-phase AC power thus generated is converted to specific DC power via the inverter unit INV. The DC power resulting from the conversion is then provided to the battery BA. The battery BA is thus charged with the DC power provided thereto.

When the hybrid electric vehicle is engaged in four-wheel-drive operation (on a low μ road, such as a snow-covered road with the engine EN running in a range of good operational efficiency (fuel efficiency)), the rear wheels WH-R are driven with the rear-side motor/generator RMG. In addition, the engine EN drives the front wheels WH-F, as in the regular traveling operation described earlier. Furthermore, since the amount of power charged into the battery BA decreases as the rear-side motor/generator RMG is driven, the battery BA is charged by rotationally driving the front-side motor/generator FMG with the rotational output of the engine EN, as in the regular traveling operation described earlier. In order to enable the rear-side motor/generator RMG to drive the rear wheels WH-R, the DC power originating from the battery BA is provided to the inverter unit NV. The DC power provided to the inverter unit INV is converted to three-phase AC power at the inverter unit INV, and the AC power resulting from the conversion is provided to the stator winding of the rear-side motor/generator RMG. The rear-side motor/generator RMG is thus driven with the AC power and generates a rotational output. The rotational output thus generated is slowed at the rear-side speed reducer RG and the slowed rotational output is then input to the differential RDF. The differential RDF divides the rotational output input thereto so that part of the rotational output is transmitted to the one of the rear wheel axles DS-R 1 and DS-R 2 near the rear wheel WH-R and the remaining part is transmitted to the another rear wheel axles DS-R 1 and DS-R 2 near the rear wheel WH-R. As a result, the rear wheel axle DS-R is rotationally driven. As the rear wheel axles DS-R 1 and DS-R 2 are rotationally driven as described above, the rear wheels WH-R are also rotationally driven.

While the hybrid electric vehicle accelerates, the front wheels WH-F are driven with the engine EN and the front-side motor/generator FMG. It is to be noted that the embodiment is described by assuming that the engine EN and the front-side motor/generator FMG drive the front wheels WH-F while the hybrid electric vehicle accelerates. However, the present invention is not limited to this example and it may be adopted in a hybrid electric vehicle, the front wheels WH-F of which are driven with the engine EN and the front-side motor/generator FMG and the rear wheels WH-R of which are driven with the rear-side motor/generator RMG (i.e., a vehicle engaged in four-wheel-drive). The rotational output provided via the engine EN and the front-side motor/generator FMG is input to the transmission TM via the output control mechanism (not shown). The rotational output input to the transmission TM is altered at the transmission TM. The rotational output having undergone the speed change is then transmitted to the front wheel axle DS-F via the differential FDF. The front wheels WH-F are thus rotationally driven.

When the hybrid electric vehicle is engaged in regenerative operation (when the vehicle is slowing down due to a braking operation, lessening the extent of accelerator pedal operation or releasing the accelerator pedal), the rotational output from the front wheels WH-F is transmitted to the front-side motor/generator FMG via the front wheel axle DS-F, the differential FDF, the transmission TM and the output control mechanism (not shown), and thus, the front-side motor/generator FMG is rotationally driven. The front-side motor/generator FMG is thus able to operate as a generator. Through the generator operation of the front-side motor/generator FMG, three-phase AC power is generated at the stator winding of the front-side motor/generator FMG. The three-phase AC power thus generated is converted to specific DC power via the inverter unit NV. The DC power resulting from the conversion is then provided to the battery BA. The battery BA is thus charged with the DC power provided thereto. The rotational output from the rear wheels WH-R is transmitted to the rear-side motor/generator RMG via the rear wheel axles DS-R 1 and DS-R 2, the differential RDF of a vehicle output transmission 100 and the speed reducer RG, and the rear-side motor/generator RMG is thus rotationally driven. In this situation, the rear-side motor/generator RMG is able to operate as a generator. Through the generator operation of the rear-side motor/generator RMG, three-phase AC power is generated at the stator winding of the rear-side motor/generator RMG. The three-phase AC power thus generated is converted to specific DC power via the inverter unit INV. The DC power resulting from the conversion is then provided to the battery BA. The battery BA is charged with the DC power provided thereto.

With the rotating electric machine insulation diagnosis device according to the present invention installed in a hybrid electric vehicle or an electric vehicle engaged in complex operations, insulation diagnosis can be executed for a rotating electrical machine while the vehicle is traveling or during a mandatory vehicle inspection, as has been explained.

It is to be noted that the embodiments described above and variations thereof may be adopted in any conceivable combination.

The following advantages are achieved through the embodiments and variations thereof. Firstly, the rotating electric machine 10 for an electric vehicle installed in a vehicle and driven by the inverter power source 7 is equipped with the partial discharge measuring sensor 4 capable of measuring a partial discharge occurring in an insulated area between windings, between phases or between the rotating electric machine and the ground. Thus, the insulation conditions of the rotating electric machine 10 for an electric vehicle, which is driven via the inverter power source 7, can be diagnosed with ease and at low cost while the rotating electric machine 10 is engaged in regular operation without having to dismount the rotating electric machine 10 from the electric vehicle.

In addition, the partial discharge measuring sensor 4 achieved in an embodiment and variation thereof described above is constituted with an electrically conductive wire wound around the entire circumferential edge of the stator core 20 over an area close to a coil end 21 of the stator coil. With the conductive wire, electromagnetic waves induced by a partial discharge can be detected. This means that a partial discharge occurring at the rotating electric machine 10 for an electric vehicle, manufactured as an integrated part of the gearbox and the like, can be measured with ease and at low cost without having to disengage the rotating electric machine 10 from the vehicle. In addition, at the rotating electric machine 10 for an electric vehicle driven with the inverter power source 7, a high voltage is applied to the insulated areas between the phases and between the windings, and also to the insulated areas between the rotating electric machine 10 and the ground. With the partial discharge measuring sensor 4, partial discharges occurring in such insulated areas, too, can be measured with a high level of reliability and at low cost.

The partial discharge measuring sensor 4 achieved in an embodiment and variation thereof is constituted with a temperature sensor 41 (see FIGS. 6 and 9) that measures the temperature inside the rotating electric machine 10 and a capacitance 42 or 500 located near the temperature sensor 41 is connected to the ends of the two output lines of the temperature sensor 41. The output lines extending from the temperature sensor 41 are wound around the entire circumferential edge of the stator core 20 near a coil end 21 of the stator coil. Thus, the temperature sensor can also be utilized as a partial discharge measuring sensor. In other words, an optimal partial discharge measuring means can be provided in an electric vehicle or a hybrid electric vehicle that constantly faces challenges such as further miniaturization, lighter weight and a further reduction in the number of required components, without having to install a special sensor to be exclusively used for purposes of partial discharge measurement.

In an embodiment and variations thereof described above, one conductive wire extending from the partial discharge measuring sensor set or one output line extending from the temperature sensor/partial discharge measuring sensor set is disposed so as to encircle the entire circumferential edge of the stator core 20 along the clockwise direction over the area near one coil end 21 of the stator coil. The other conductive wire or the other output line, on the other hand, is disposed so as to encircle the stator core 20 in the counterclockwise direction over an area near the other coil end 21 of the stator coil. As a result, partial discharge signal data intensify each other and thus an amplified partial discharge signal can be obtained, thereby enabling partial discharge measurement at a high level of sensitivity while inverter pulse noise data cancel each other out and thus inverter pulse noise is suppressed.

The rotating electric machine 10 achieved in the embodiments and variations thereof is equipped with a temperature sensor 3 or 41 used to measure the temperature inside the rotating electric machine 10, an atmospheric pressure sensor 1 used to measure the atmospheric pressure inside the rotating electric machine 10 and a humidity sensor 2 used to measure the humidity inside the rotating electric machine 10. Thus, the conditions in the environment within the rotating electric machine 10 can be detected during a partial discharge measurement, a partial discharge measurement value can be converted to a measurement value under specific conditions and the insulation conditions at the rotating electric machine 10 can be diagnosed with better accuracy based upon the partial discharge measurement value resulting from the conversion.

The structures achieved in the embodiments and variations thereof each include the piping and the valve 16 communicating with the inside of the rotating electric machine 10. This means that partial discharge measurement can be executed without having to apply a drive voltage any higher than the drive voltage applied during regular operation, to the rotating electric machine 10 or without having to generate an induced voltage any higher than that induced during regular operation at the rotating electric machine 10. In addition, since the inverter power source 7 does not need to assure high voltage withstanding performance, the drive control device for the rotating electric machine 10 can be provided at lower cost.

The configurations achieved in the embodiments and variations thereof each include an external power terminal 17 via which power is exchanged with the external power source 14, as well as the power terminal used to exchange power with the inverter power source 7. Thus, partial discharge measurement can be executed by applying a test voltage, originating from the external power source 14 and provided via the external power terminal 17, to the rotating electric machine 10. This eliminates the need for assuring a high level of voltage withstanding performance at the inverter power source 7 and also eliminates the need for engaging the drive control device of the rotating electric machine 10 in complex operations for purposes of partial discharge measurement. As a result, the cost related to the drive control device for the rotating electric machine 10 can be reduced.

The configurations achieved in the embodiments and variations thereof each include an inverter power source 7, which drives the rotating electric machine 10 by applying an inverter pulse voltage to the rotating electric machine 10, a partial discharge detector 5 and a control/data processing device 6, via which a partial discharge signal is extracted from a signal output from a partial discharge measuring sensor 4 or 41, and a control/data processing device 6, which detects a partial discharge inception voltage PDIV based upon the extracted partial discharge signal and executes insulation diagnosis for the rotating electric machine 10 based upon the change occurring in the partial discharge inception voltage PDIV over time. Thus, the insulation conditions of the rotating electric machine 10 for an electric vehicle, which is driven with the inverter power source 7, can be diagnosed with ease and at low cost with the drive control device that controls drive of the rotating electric machine 10 for an electric vehicle, while the rotating electric machine 10 is engaged in regular operation without having to dismount the rotating electric machine 10 from the electric vehicle.

During the insulation diagnosis for the rotating electric machine 10, the inverter power source 7 in the embodiments and variations thereof applies an inverter pulse voltage so as to drive the rotating electric machine 10 with a drive voltage higher than the drive voltage applied during regular operation. The output signal provided by the partial discharge measuring sensor 4 or 41 undergoes high pass filter processing executed via the partial discharge detector 5 and the control/data processing device 6. Through the high-pass filter processing, a partial discharge signal, free of inverter pulse noise attributable to the inverter power source 7, is extracted. Consequently, a partial discharge occurring in the rotating electric machine 10 for an electric vehicle, which is driven by the inverter power source 7, can be detected with accuracy and ease.

The high pass filter 52 in the partial discharge detector 5 achieved in the embodiments and variations thereof has a cutoff frequency assumed at the point at which the frequency spectrum of the inverter pulse noise and the frequency spectrum of the minimum partial discharge signal intersect each other. Through such a high pass filter 52, the inverter pulse noise can be separated and removed from the signal output from the partial discharge measuring sensor 4 or 41 and the partial discharge measurement signal can thus be extracted with a high degree of accuracy.

During the insulation diagnosis for the rotating electric machine 10, the inverter power source 7 in the embodiments and variations thereof applies an inverter pulse voltage so as to drive the rotating electric machine 10 with a drive voltage higher than the drive voltage applied during regular operation. The partial discharge detector 5 and the control/data processing device 6 extract, as a partial discharge signal, the signal component generated at a phase other than the phase at which the inverter pulse noise attributable to the inverter power source 7 has occurred, from the signal output from the partial discharge measuring sensor 4 or 41. As a result, the inverter pulse noise is separated and removed from the signal output from the partial discharge measuring sensor 4 or 41 and the partial discharge measurement signal is thus extracted with a high degree of accuracy.

During the insulation diagnosis executed for the rotating electric machine 10, the inverter power source 7 achieved in the embodiments and variations thereof executes field control for the rotating electric machine 10 so as to induce a voltage at the rotating electric machine 10, which is higher than the voltage induced during regular operation. The partial discharge detector 5 and the control/data processing device 6 extract the partial discharge signal by eliminating the induced voltage component attributable to the induced voltage generated at the rotating electric machine 10 from the signal output from the partial discharge measuring sensor 4 or 41. As a result, the induced voltage component is separated and removed from the signal output from the partial discharge measuring sensor 4 or 41 and the partial discharge measurement signal is thus extracted with a high degree of accuracy.

The configurations achieved in the embodiments and variations thereof each include an inverter power source 7, which drives the rotating electric machine 10 by applying an inverter pulse voltage to the rotating electric machine 10, a partial discharge detector 5 and a control/data processing device 6, via which a partial discharge signal is extracted from a signal output from a partial discharge measuring sensor 4 or 41, and a control/data processing device 6, which detects a partial discharge inception voltage PDIV based upon the extracted partial discharge signal and executes insulation diagnosis for the rotating electric machine 10 based upon the change occurring in the partial discharge inception voltage PDIV over time. In addition, during the insulation diagnosis executed for the rotating electric machine 10, the internal atmospheric pressure at the rotating electric machine 10 is lowered via a vacuum pump 15 connected to piping and a valve 16. This means that partial discharge measurement can be executed without having to apply a drive voltage any higher than the drive voltage applied during regular operation to the rotating electric machine 10 or without having to generate an induced voltage any higher than that induced during regular operation, at the rotating electric machine 10. Thus, since the inverter power source 7 does not need to assure high voltage withstanding performance, the drive control device for the rotating electric machine 10 can be provided at lower cost.

The configurations achieved in the embodiments and variations thereof each include an inverter power source 7, which drives the rotating electric machine 10 by applying an inverter pulse voltage to the rotating electric machine 10, a circuit breaker 11 disposed between the inverter power source 7 and the rotating electric machine 10, a partial discharge detector 5 and a control/data processing device 6, via which a partial discharge signal is extracted from a signal output from a partial discharge measuring sensor 4 or 41, and a control/data processing device 6, which detects a partial discharge inception voltage PDIV based upon the extracted partial discharge signal and executes insulation diagnosis for the rotating electric machine 10 based upon the change occurring in the partial discharge inception voltage PDIV over time. During the insulation diagnosis executed for the rotating electric machine 10, the circuit breaker 11 is opened and an insulation test voltage originating from an external power source 14 and provided via an external power terminal 17, is applied to the rotating electric machine 10. In other words, partial discharge measurement can be executed with the test voltage originating from the external power source 14 and provided via the external power terminal 17, applied to the rotating electric machine 10. This eliminates the need for assuring a high level of voltage withstanding performance at the inverter power source 7 and also eliminates the need for engaging the drive control device of the rotating electric machine 10 in complex operations for purposes of partial discharge measurement. As a result, the cost related to the drive control device for the rotating electric machine 10 can be reduced.

In the embodiments and variations thereof, the temperature, the humidity and the atmospheric pressure at the rotating electric machine 10 measured during an insulation diagnosis executed for the rotating electric machine 10 are recorded together with the partial discharge inception voltage PDIV into a memory **6*b* by a control/data processing device 6. The configuration further includes a control/data processing device 6 that converts the partial discharge inception voltage PDIV thus recorded to a value corresponding to the specific temperature, the specific humidity and the specific atmospheric pressure at the rotating electric machine 10. The control/data processing device 6 then diagnosis the insulation conditions at the rotating electric machine 10 based upon the partial discharge inception voltage value PDIV resulting from the conversion. In other words, the insulation diagnosis for the rotating electric machine 10** can be executed with an even higher level of accuracy based upon the partial conversion measurement value obtained by converting the initial partial discharge measurement value to a measurement value corresponding to specific environment conditions.

The control/data processing device 6 achieved in the embodiments and variations thereof executes the insulation diagnosis based upon the change occurring in the partial discharge inception voltage PDIV over time by factoring in thermal deterioration, mechanical deterioration, oil resistance deterioration and hydrolysis resistance deterioration in the insulated areas of the rotating electric machine 10 between the windings, between the phases and between the rotating electric machine 10 and the ground. As a result, a further improvement is achieved in the accuracy of the insulation diagnosis executed for the rotating electric machine 10.

While the invention has been particularly shown and described with respect to preferred embodiments and variations thereof by referring to the attached drawings, the present invention is not limited to these examples and it will be understood by those skilled in the art that various changes in form and detail may be made therein without departing from the spirit, scope and teaching of the invention.

The disclosure of the following priority application is herein incorporated by reference:

Japanese Patent Application No. 2009-284794 filed Dec. 16, 2009

The invention claimed is:

1. A rotating electric machine for an electric vehicle, installed in a vehicle and driven by an inverter power source, comprising:

a partial discharge measuring device that measures partial discharges occurring in insulated areas between windings, between phases and between the rotating electric machine and a ground, wherein the partial discharge measuring device is configured with a temperature sensor that measures a temperature inside the rotating electric machine and an electromagnetic capacitance connected to ends of two output lines extending from the temperature sensor, with the output lines extending from the temperature sensor wound around an entire circumference of a stator core over an area near a coil end of the stator coil.

2. The rotating electric machine for an electric vehicle according to claim 1, wherein:

the partial discharge measuring device detects electromagnetic waves induced by a partial discharge.

3. The rotating electric machine for an electric vehicle according to claim 1 further comprising: an atmospheric pressure sensor that measures atmospheric pressure in the rotating electric machine.

4. The rotating electric machine for an electric vehicle according to claim 1 further comprising: a humidity sensor that measures humidity in the rotating electric machine.

5. The rotating electric machine for an electric vehicle according to claim 1 further comprising: piping and a valve in communication with the inside of the rotating electric machine.

6. The rotating electric machine for an electric vehicle according to claim 1 further comprising:

power terminal via which power is exchanged with an external power source, the external power terminal being provided independent of a power terminal via which power is exchanged with the inverter power source.

7. A drive control device that controls drive of the rotating electric machine for an electric vehicle according to claim 1, the drive control device comprising: an inverter power source that drives the rotating electric machine by applying an inverter pulse voltage to the rotating electric machine; an extraction unit that extracts a partial discharge signal from an output signal provided from the partial discharge measuring device; and a diagnosis unit that detects a partial discharge inception voltage based upon the partial discharge signal extracted by the extraction unit and executes insulation diagnosis for the rotating electric machine based upon a change occurring in the partial discharge inception voltage over time.

8. The drive control device according to claim 7, wherein: during the insulation diagnosis executed for the rotating electric machine, the inverter power source applies an inverter pulse voltage, the inverter voltage being higher than a drive voltage applied for the rotating electric machine during regular operation; and the extraction unit extracts the partial discharge signal by executing high pass filter processing on the output signal from the partial discharge measuring device, thus removing inverter pulse noise attributable to the inverter power source.

9. The drive control device according to claim 8, wherein: the high pass filter has a cutoff frequency assumed at a point at which a frequency spectrum of the inverter pulse noise and a frequency spectrum of a minimum partial discharge signal intersect each other.

10. The drive control device according to claim 7, wherein: during the insulation diagnosis executed for the rotating electric machine, the inverter power source applies an inverter pulse voltage, the inverter pulse voltage being higher than a drive voltage applied for the rotating electric machine during regular operation; and the extraction unit extracts, as the partial discharge signal, a signal generated at a phase in the output signal from the partial discharge measuring device, the phase being different from a phase at which inverter pulse noise attributable to the inverter power source has occurred.

11. The drive control device according to claim 7, wherein: during the insulation diagnosis executed for the rotating electric machine, the inverter power source executes field control for the rotating electric machine so as to induce at the rotating electric machine a voltage higher than the voltage induced during regular operation; and the extraction unit extracts the partial discharge signal by removing an induced voltage component from the output signal from the partial discharge measuring device, the induced voltage component representing the induced voltage generated at the rotating electric machine.

12. The drive control device according to claim 7, further comprising: a recording unit that records, together with the partial discharge inception voltage, temperature, humidity and atmospheric pressure at the rotating electric machine measured during the insulation diagnosis executed for the rotating electric machine; and a conversion unit that converts the partial discharge inception voltage recorded in the recording unit to a value corresponding to a specific temperature, specific humidity and a specific atmospheric pressure measured at the rotating electric machine, wherein: the diagnosis unit diagnoses an insulation conditions at the rotating electric machine based upon the partial discharge inception voltage value resulting from conversion executed by the conversion unit.

13. The drive control device according to claim 7, wherein: the diagnosis unit executes insulation diagnosis based upon change occurring in the partial discharge inception voltage over time by factoring in thermal deterioration, mechanical deterioration, oil resistance deterioration and hydrolysis resistance deterioration occurring in insulated areas of the rotating electric machine, located between windings, between phases and between the rotating electric machine and a ground.

14. A drive control device that controls drive of the rotating electric machine for an electric vehicle according to claim 5, the drive control device comprising: an inverter power source that drives the rotating electric machine by applying an inverter pulse voltage to the rotating electric machine; an extraction unit that extracts a partial discharge signal from an output signal provided from the partial discharge measuring device; and a diagnosis unit that detects a partial discharge inception voltage based upon the partial discharge signal extracted by the extraction unit and executes insulation diagnosis for the rotating electric machine based upon a change occurring in the partial discharge inception voltage over time, wherein: during the insulation diagnosis executed for the rotating electric machine, an internal atmospheric pressure at the rotating electric machine is lowered via a vacuum pump connected to the piping and the valve.

15. A drive control device that controls drive of the rotating electric machine for an electric vehicle according to claim 6, the drive control device comprising: an inverter power source that drives the rotating electric machine by applying an inverter pulse voltage to the rotating electric machine; a circuit breaker unit disposed between the inverter power source in the rotating electric machine;

an extraction unit that extracts a partial discharge signal from an output signal provided from the partial discharge measuring device; and a diagnosis unit that detects a partial discharge inception voltage based upon the partial discharge signal extracted by the extraction unit and executes insulation diagnosis for the rotating electric machine based upon a change occurring in the partial discharge inception voltage over time, wherein: during the insulation diagnosis executed for the rotating electric machine, the circuit breaker unit is opened and an insulation test voltage is applied to the rotating electrical machine, the insulation test voltage being originated from the external power source and being provided via the external power terminal.

16. The rotating electric machine for an electric vehicle according to claim 2 wherein a conductive wire or one of the output lines located on one side of an axial direction is disposed so as to run along the entire circumference of the stator core in a clockwise direction over the area near the coil end of the stator coil and the conductive wire or the one of the output lines located on another side of the axial direction is disposed so as to run along the circumference of the stator core in a counterclockwise direction over an area near another coil end of the stator coil.

17. An insulation diagnosis method adopted in conjunction with a rotating electric machine for an electric vehicle, comprising:

measuring, via a partial discharge measuring device, a partial discharge occurring in an insulated area of the rotating electric machine for an electric vehicle, which is installed in a vehicle and driven with an inverter power source, the insulating area being between windings or between phases at the rotating electric machine or between the rotating electric machine and a ground;

extracting a partial discharge signal from an output signal provided from the partial discharge measuring device;

detecting a partial discharge inception voltage based upon the extracted partial discharge signal;

executing insulation diagnosis for the rotating electric machine for an electric vehicle based upon a change occurring in the partial discharge inception voltage over time, and configuring the partial discharge measuring device with a temperature sensor that measures a temperature inside the rotating electric machine and an electromagnetic capacitance connected to ends of two output lines extending from the temperature sensor, with the output lines extending from the temperature sensor wound around an entire circumference of a stator core over an area near a coil end of the stator coil.

* * * * *